US009991223B2

(12) United States Patent
Aoki et al.

(10) Patent No.: US 9,991,223 B2
(45) Date of Patent: Jun. 5, 2018

(54) SEMICONDUCTOR PACKAGE ALIGNMENT FRAME FOR LOCAL REFLOW

(71) Applicant: Intel Corporation, Santa Clara, CA (US)

(72) Inventors: Russell S. Aoki, Tacoma, WA (US); Michael R. Hui, Tacoma, WA (US); Jonathon R. Carstens, Lacey, WA (US); Michael S. Brazel, Federal Way, WA (US); Daniel P. Carter, Olympia, WA (US); Thomas A. Boyd, North Plains, OR (US); Shelby A. Ferguson, Lacey, WA (US); Rashelle Yee, Puyallup, WA (US); Joseph J. Jasniewski, Olympia, WA (US); Harvey R. Kofstad, Vernonia, OR (US); Anthony P. Valpiani, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 14/975,532

(22) Filed: Dec. 18, 2015

(65) Prior Publication Data

US 2017/0179067 A1      Jun. 22, 2017

(51) Int. Cl.
*B23K 3/08*      (2006.01)
*H04L 23/00*     (2006.01)
(Continued)

(52) U.S. Cl.
CPC ............ *H01L 24/75* (2013.01); *B23K 1/0016* (2013.01); *B23K 3/087* (2013.01); *H01L 24/81* (2013.01);
(Continued)

(58) Field of Classification Search
None
See application file for complete search history.

(56) References Cited

U.S. PATENT DOCUMENTS 4,118,092 A * 10/1978 Sado ................. G04G 17/06
                                                439/66
5,167,326 A * 12/1992 Murphy ............ G01R 1/0408
                                                206/719
(Continued)

FOREIGN PATENT DOCUMENTS

WO      2015152855 A1    10/2015

OTHER PUBLICATIONS

International Search Report and Written Opinion dated Feb. 28, 2017 for International Application No. PCT/US2016/062096, 14 pages.

*Primary Examiner* — Devang R Patel
(74) *Attorney, Agent, or Firm* — Schwabe, Williamson & Wyatt, P.C.

(57) ABSTRACT

Embodiments of the present disclosure describe package alignment frames for a local reflow process to attach a semiconductor package to an interposer. The frame may comprise a two frame system. The interposer may be on a mounting table or on a circuit board. The frame may include a body with a rectangular opening dimensioned to receive a semiconductor package to be coupled to the interposer. The frame may be to align a ball grid array of the semiconductor package with pads of the interposer. A second frame may be to receive the first frame and may be to align a ball grid array of the interposer with pads of the circuit board. A single frame may be used to couple a semiconductor package to an interposer and to couple the interposer to a circuit board. Other embodiments may be described and/or claimed.

14 Claims, 13 Drawing Sheets

(51) Int. Cl.
*H01L 23/00* (2006.01)
*B23K 1/00* (2006.01)
*B23K 101/42* (2006.01)

(52) U.S. Cl.
CPC .............................. *B23K 2201/42* (2013.01); *H01L 2224/75253* (2013.01); *H01L 2224/75703* (2013.01); *H01L 2224/75754* (2013.01); *H01L 2224/81139* (2013.01)

(56) References Cited

U.S. PATENT DOCUMENTS

| | | | |
|---|---|---|---|
| 5,321,583 A * | 6/1994 | McMahon | H01R 13/2414 174/255 |
| 5,688,127 A * | 11/1997 | Staab | G01R 1/04 439/66 |
| 5,745,346 A * | 4/1998 | Ogawa | H01L 23/32 361/767 |
| 6,181,567 B1 * | 1/2001 | Roemer | H05K 3/325 174/255 |
| 6,541,991 B1 * | 4/2003 | Hornchek | G01R 1/0483 324/754.07 |
| 6,750,551 B1 | 6/2004 | Frutschy et al. | |
| 6,917,525 B2 * | 7/2005 | Mok | G01R 1/06716 361/767 |
| 7,352,197 B1 * | 4/2008 | Mardi | G01R 1/0408 324/750.25 |
| 2004/0075091 A1 * | 4/2004 | Huang | G01R 1/0483 257/48 |
| 2004/0223309 A1 * | 11/2004 | Haemer | G01R 1/07314 361/767 |
| 2005/0146017 A1 | 7/2005 | Koide | |
| 2005/0237074 A1 * | 10/2005 | Karavakis | G01R 1/0483 324/754.18 |
| 2008/0061808 A1 * | 3/2008 | Mok | C23C 26/00 324/754.14 |
| 2011/0134606 A1 | 6/2011 | Gallarelli et al. | |
| 2014/0000811 A1 * | 1/2014 | Norton | H05K 7/1061 156/351 |

\* cited by examiner

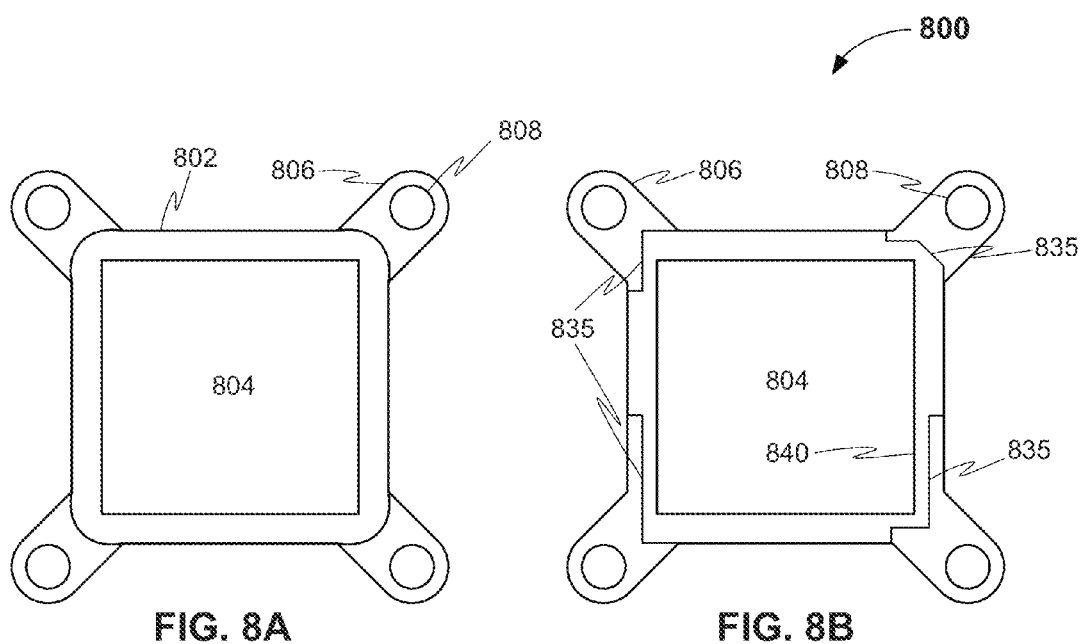
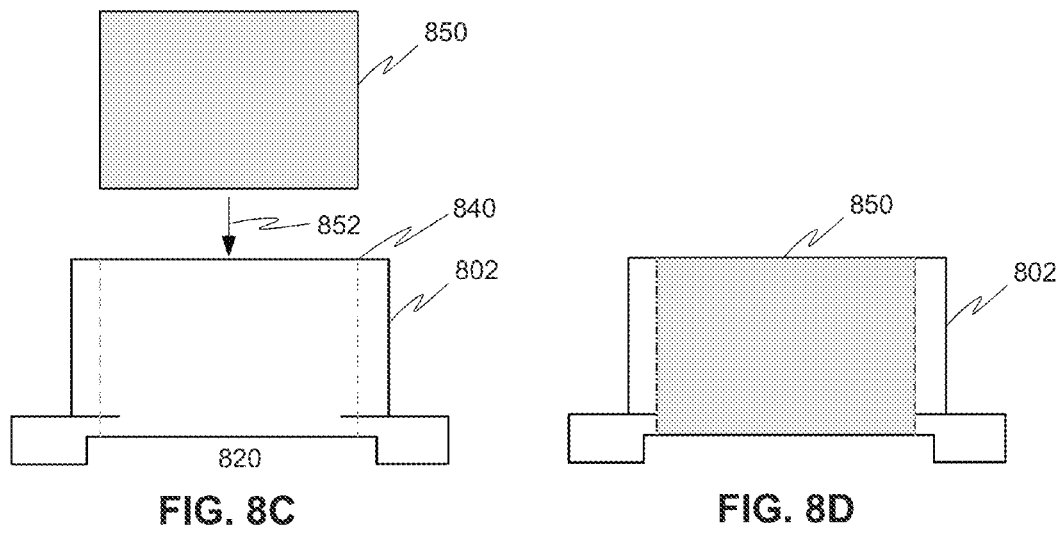
FIG. 8A  FIG. 8B
FIG. 8C  FIG. 8D

SEMICONDUCTOR PACKAGE ALIGNMENT FRAME FOR LOCAL REFLOW

FIELD

Embodiments of the present disclosure generally relate to semiconductor integrated circuits and more specifically to interfaces, systems, and methods for attachment of semiconductor packages to circuit boards by local reflow processes.

BACKGROUND

Electronic assembly generally includes coupling of electrical components to a printed circuit board (PCB). A typical assembly process may include a high volume solder reflow process referred to as surface mount technology (SMT). In SMT, a solder paste typically is applied to a PCB by a screen printing process. Electronic components typically are placed on the PCB with the leads of the components contacting the pads with the solder paste. The PCB typically is placed in a solder reflow oven to heat the solder paste to its liquidus temperature to join the components to the PCB. For some assembly requirements, however, there may be a need to attach an electronic component without using a solder reflow oven. For example, some assembly requirements may need to have an electronic component attached after an SMT process is completed. These assembly requirements may need a local reflow soldering process to complete assembly of a PCB.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 8A-8D schematically illustrates a second alignment frame, in accordance with some embodiments.

DETAILED DESCRIPTION

Figure 1:
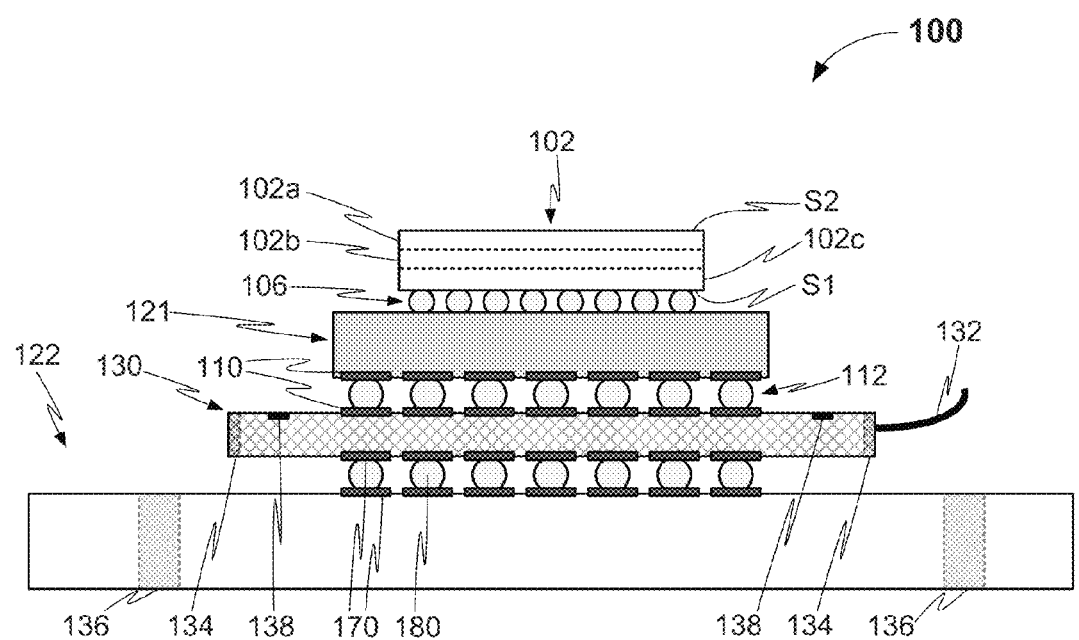
FIG. 1 schematically illustrates a cross-section side view of an integrated circuit (IC) assembly, in accordance with some embodiments.

Embodiments of the present disclosure describe semiconductor package alignment frames and systems and processes for local reflow to attach package substrates to interposers and circuit boards using the semiconductor package alignment frames.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The terms "coupled to" and "coupled with," along with all derivatives, may be used herein. "Coupled" may mean one or more of the following. "Coupled" may mean that two or more elements are in direct physical and/or electrical contact. However, "coupled" may also mean that two or more elements indirectly contact each other, but yet still cooperate or interact with each other, and may mean that one or more other elements are coupled or connected between the elements that are said to be coupled to each other. The term "directly coupled" may mean that two or more elements are in direct contact. By way of example and not limitation, "coupled" may mean two or more elements or devices are coupled by electrical connections on a printed circuit board such as a motherboard, for example. The electrical connections may provide direct physical coupling by way of the electrical connections. By way of example and not limitation, "coupled" may mean two or more elements/devices cooperate and/or interact through one or more network linkages such as wired and/or wireless networks. By way of example and not limitation, a computing apparatus may include two or more computing devices "coupled" by one or more network linkages.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine, and/or other suitable components that provide the described functionality.

FIG. 1 schematically illustrates a cross-section side view of an integrated circuit (IC) assembly 100, in accordance with some embodiments. In some embodiments, the IC assembly 100 may include one or more dies (hereinafter "die 102") electrically and/or directly coupled to a package substrate 121. In some embodiments, the package substrate 121 may be electrically coupled to an interposer 130. In some embodiments, the interposer 130 may be electrically and/or physically coupled to a circuit board 122. In some embodiments, the IC assembly 100 may include one or more of the die 102, the package substrate 121, and/or the interposer 130 coupled to the circuit board 122, according to various embodiments.

The die 102 may represent a discrete product made from a semiconductor material (e.g., silicon) using semiconductor fabrication techniques such as thin film deposition, lithography, etching, and the like used in connection with forming the die 102. The die 102 may be a complementary metal oxide semiconductor (CMOS) device. In some embodiments, the die 102 may be, include, or be a part of a processor, memory, system on chip (SoC) or application specific integrated circuit (ASIC). In some embodiments, an electrically insulative material such as, for example, molding compound or underfill material (not shown) may encapsulate at least a portion of the die 102 and/or die-level interconnect structures 106. The molding compound and/or underfill material may be coupled to the package substrate 121.

The die 102 may be attached to the package substrate 121 according to a wide variety of suitable configurations including, for example, being directly coupled to the package substrate 121 in a flip-chip configuration, as depicted. In the flip-chip configuration, an active side, S1, of the die 102 including circuitry is attached to a surface of the package substrate 121 using die-level interconnect structures 106 such as bumps, pillars, or other suitable structures that may also electrically couple the die 102 with the package substrate 121. The active side S1 of the die 102 may include active devices such as, for example, transistor devices. An inactive side, S2, may be disposed opposite to the active side S1, as can be seen.

The die 102 generally may include a semiconductor substrate 102a, one or more device layers (hereinafter "device layer 102b") and one or more interconnect layers (hereinafter "interconnect layer 102c"). The semiconductor substrate 102a may be substantially composed of a bulk semiconductor material such as, for example, silicon. The device layer 102b may represent a region where active devices such as transistor devices are formed on the semiconductor substrate. The device layer 102b may include, for example, transistor structures such as channel bodies and/or source/drain regions of transistor devices. The interconnect layer 102c may include interconnect structures (e.g., electrode terminals) that are to route electrical signals to or from the active devices in the device layer 102b. For example, the interconnect layer 102c may include horizontal lines (e.g., trenches) and/or vertical plugs (e.g., vias) or other suitable features to provide electrical routing and/or contacts.

In some embodiments, the die-level interconnect structures 106 may be electrically coupled with the interconnect layer 102c and are to route electrical signals between the die 102 and other electrical devices. The electrical signals may include, for example, input/output (I/O) signals and/or power/ground signals that are used in connection with operation of the die 102.

In some embodiments, the package substrate 121 may be an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features that are to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) that are to receive the respective die-level interconnect structures 106 of the die 102.

The interposer 130 may be comprised of build-up layers typically used for semiconductor devices and substrates. The interposer 130 may include pads 110 to couple with package substrate 121 via solder balls 112 and pads 110 on package substrate 121, as illustrated. The package substrate 121 with pads 110 and solder balls 112 may be a ball grid array (BGA) that is mounted to the interposer 130 in a reflow process. The interposer 130 may include electrical routing features that are to route electrical signals to and/or from the package substrate 121. The electrical routing features may be in and/or on the interposer 130. The electrical routing features may include, for example, pads or traces disposed on one or more surfaces of the interposer 130 and/or internal routing features such as, for example, trenches, vias, or other interconnect structures to route electrical signals through the interposer 130.

The interposer 130 may be electrically and/or physically coupled to the circuit board 122. For example, the interposer 130 may be coupled to the circuit board 122 by a surface mount technology (SMT). The interposer 130 may be mounted via SMT to the circuit board 122 before the package substrate 121 is mounted to the interposer 130 via a reflow process.

The interposer 130 may include heater elements (208, FIG. 2) to reflow solder balls 112 to attach package substrate 121 to the interposer 130 in a reflow process. The interposer 130 may include electrical features 132 coupled to interposer 130 to provide power to the heater elements 208. The electrical features 132 may include feedback and/or control signal lines such as a temperature sensor line to control the temperature of the heater elements 208. The electrical features 132 may be one or more electrical lines coupled to the interposer 130.

The interposer 130 may include interlock 134 to receive and align a package alignment frame for coupling of package substrate 121 to interposer 130. A package alignment frame may be as illustrated in FIGS. 3-6. The interlock 134 may be provided by a perimeter shape of the interposer to mate with and couple to a complementary interlock of a package alignment frame. The interlock 134 of the interposer 130 and the complementary interlock of a package alignment frame may be referred to as an interlock mechanism. The interlock mechanism may prevent movement of a package alignment frame in the plane of the interposer. The interlock mechanism may include a compression mechanism and/or cantilever mechanism to provide resistance to removal of a package alignment frame out of the plane of the interposer. The amount of resistance may be an amount to prevent a package alignment frame from being removed until a threshold value of force is applied to a package alignment frame. This force may be a force that is out of the plane of the interposer. For example, the interlock mechanism may include a snap and lock type mechanism to temporarily lock a package alignment frame onto the interposer 130 and the circuit board 122. The interlock mechanism may comprise an interlock on the circuit board 122 and an interlock on a package alignment frame. The interlocking mechanism may prevent movement of the package alignment frame until a threshold force is applied to overcome the locking force of the interlocking mechanism.

The interlock 134 may include one or more notches or holes in the interposer to receive a corresponding protrusion to align a package alignment frame to provide an interlocking mechanism. The interlock 134 may include one or more protrusions on the interposer 130 to mate with one or more notches or holes in a package alignment frame to provide an interlocking mechanism.

The interposer 130 may have interconnects 138 to couple to electrical features of a package alignment frame to route electrical signals to and from the interposer 130, including the heater elements 208 and feedback and/or control signal lines. The interconnects 138 may be on a surface of the interposer 130 to couple with electrical features of a package alignment frame. The interconnects 138 may be pads. For example, the pads may be to couple with pogo pins of a package alignment frame, as illustrated by the example of FIG. 3. The interconnects 138 may be a slot or hole to receive an interconnect, such as a pin, wire, or a cantilevered structure, of a package alignment frame, as illustrated by the examples of FIGS. 4-5. The slot or hole may include a conductive material on a surface of the slot or hole. Electrical contact with the slot or hole may be achieved by a lateral force applied to the pins or wires to electrically couple to the conductive material of the slot or hole.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard. The circuit board 122 may include attachment features 136 to attach a package alignment frame to couple the package substrate 121 to the interposer 130. The attachment features 136 of the circuit board 122 may be holes passing through the circuit board 122. The attachment features 136 of the circuit board 122 may be to receive a mechanical fastener to fasten the package alignment frame to the circuit board 122.

Package-level interconnects such as, for example, solder balls 112 may be coupled to one or more pads 110 on the package substrate 121 and/or on the interposer 130 to form corresponding solder joints that are to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 through the interposer may be used in other embodiments.

The IC assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 100 may be used in some embodiments.

Figure 2:
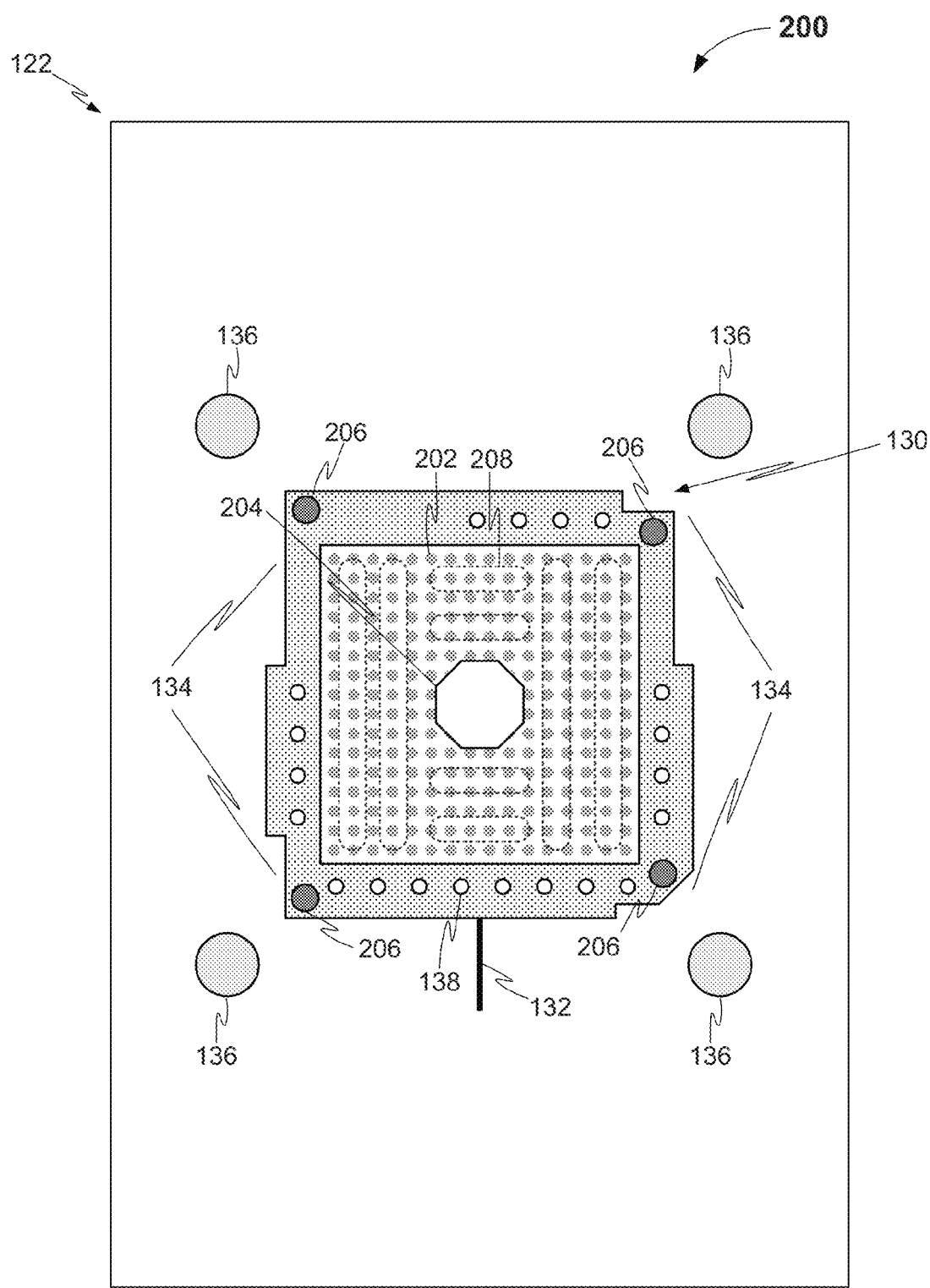
FIG. 2 schematically illustrates a top view of an integrated circuit (IC) assembly including a circuit board with an interposer, in accordance with some embodiments.

FIG. 2 schematically illustrates a top view of an integrated circuit (IC) assembly 200 including a circuit board 122 with an interposer 130, in accordance with some embodiments. The IC assembly 200 may be a top view of the circuit board 122 with the interposer 130, as illustrated in FIG. 1. The package substrate 121 and die 102 are not shown in FIG. 2 for clarity of illustrating the circuit board 122 with the interposer 130. The circuit board 122 may have the attachment features 136, as illustrated from a top view and as described herein. The attachment features 136 may be spaced around the interposer 130, as illustrated. The attachment features 136 may be to couple with a package alignment frame, as described herein, and as illustrated by an example package alignment frame of FIG. 3A, FIG. 3B, and FIG. 4.

The interposer 130 may be coupled to the circuit board 122 by SMT, as described herein. The interposer may have a plurality of pads 202 to couple with a package substrate 121 of FIG. 1. The package substrate 121 may be coupled to the pads 202 of the interposer 130 by a reflow process of a BGA, as described herein. The interposer 130 may have a region 204 without pads 202 and where circuit board 122 may be visible, as illustrated.

The interposer 130 may include interlock 134 to align a package alignment frame, as illustrated and described herein. The interlock 134 may be on a perimeter of the interposer 130, as illustrated. The interlock 134 may be located on the corner areas of the interposer 130, where a package alignment frame may align with the interlock 134 by a portion of the package alignment frame resting on the interposer 130 and a portion of the package alignment frame resting on the circuit board 122. In another embodiment, the interlock 134 may not be on a perimeter, but instead may be on a surface of the interposer as a notch, hole, slot, or protrusion, as shown by second interlock 206. In some embodiments, the interposer 130 may include one or more of the interlock 134 in combination with one or more of the second interlock 206. The interlock 134 and the second interlock 206 are to provide alignment of a package alignment frame, as illustrated by the examples of package alignment frames in FIGS. 3-6.

The interposer 130 may include electrical features 132 coupled to interposer 130, as illustrated and described herein. In some embodiments, the interposer 130 may include interconnects 138, as described herein. The electrical features 138 may include a plurality of interconnects 138 spaced on one, two, three, or four sides of the interposer 130, as illustrated. In some embodiments, the interposer may include interconnects 138 but not include electrical features 132. The interconnects 138 may be to couple with electrical routing features of a package alignment frame to route power and control through the package alignment frame and to the interposer 130.

The interposer 130 may include heater elements 208 to reflow solder balls 112 to attach package substrate 121 to the interposer 130 in a reflow process. The interposer 130 may include electrical features 132 coupled to interposer 130 to provide power to the heater elements 208. The electrical features 132 may include feedback and/or control signal lines such as a temperature sensor line to control the temperature of the heater elements 208. The electrical features 132 may be one or more electrical lines coupled to the interposer 130. The heater elements 208 may comprise one or more elements. The heater elements 208 may be resistance heater elements. The heater elements 208 may be spaced and located to provide optimal reflow conditions.

Figure 3A:
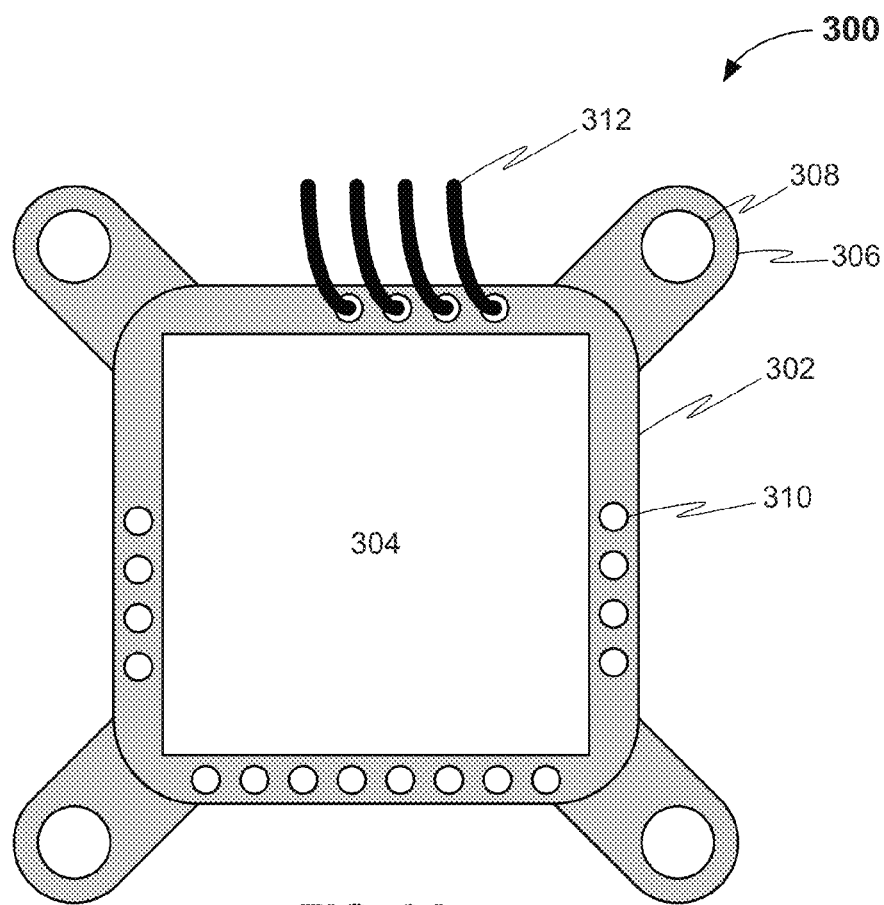
FIG. 3A and FIG. 3B schematically illustrate a top view and a bottom view, respectively, of a package alignment frame ("frame") to couple with an interposer on a circuit board for mounting of a package substrate to the interposer, in accordance with some embodiments.
Figure 3B:
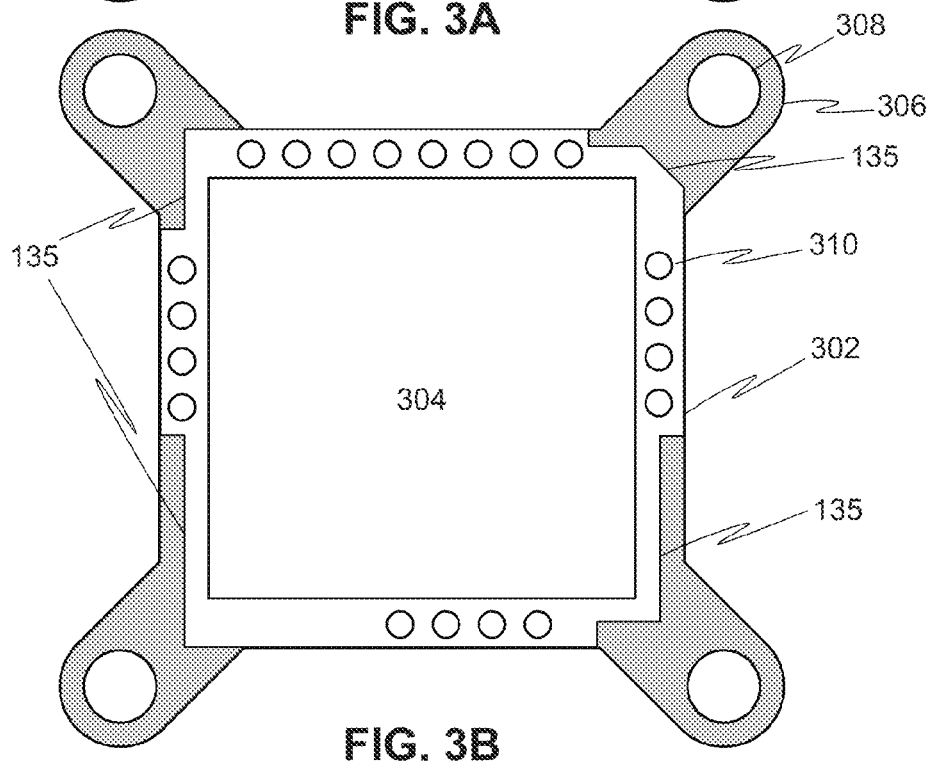
Figure 4:
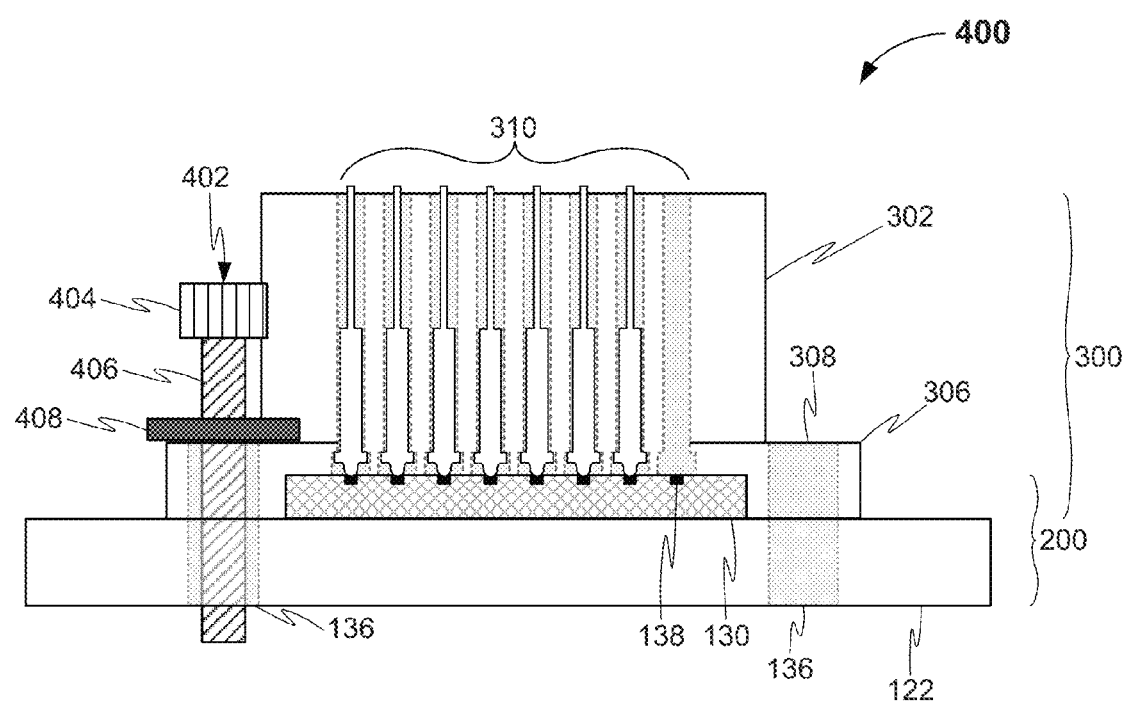
FIG. 4 schematically illustrates a side view of a package alignment system, in accordance with some embodiments.

FIG. 3A and FIG. 3B schematically illustrate a top view and a bottom view, respectively, of a package alignment frame 300 ("frame" 300) to couple with an interposer on a circuit board for mounting of a package substrate to the interposer, in accordance with some embodiments. The frame 300 may be to couple with the interposer 130. The package substrate may be any type of semiconductor package or integrated circuit assembly. The interposer 130 may be coupled to the circuit board 122 of FIG. 2 for example or any other type of circuit board.

The frame 300 may include a body 302 with an opening 304 to receive a package substrate 121 with die 102 coupled to the package substrate 121, as illustrated in FIG. 1. The frame 300 may include coupling appendages 306 with holes 308 to align with the attachment features 136 of the circuit board 122, as illustrated in FIG. 2, or an equivalent mechanical fastening device or system. The coupling appendages 306 with the holes 308 may be referred to as a lock feature to lock the frame 300 to the interposer 130 and circuit board 122.

In some embodiments, the interposer 130 may be coupled to a mounting table. The frame 300 may be coupled to the interposer 130. The package substrate 121 may be placed in the frame 300 and coupled to the interposer via reflow of a ball grid array of the package substrate 121.

In some embodiments, the frame 300 may be a first frame of a two frame system for coupling a package substrate 121 to the interposer 130. A second package alignment frame (second alignment frame) may be used to mount the interposer 130 to the circuit board 122 after the package substrate 121 is coupled to the interposer 130. The coupling appendages 306 may not be present on frame 300 to allow frame 300 to couple with a second frame. The second frame may have an open space to receive the frame 300, and the second frame may have coupling appendages 306 with holes 308 or an equivalent type of mechanical fastening device or system. The frame 300 may be configured to slide inside a second frame within reasonable engineering tolerances.

The frame 300 may include electrical routing features 310 to route electrical signals to and from an interposer 130 coupled to a circuit board 122 via the interconnects 138 of the interposer 130, as illustrated in FIG. 2. The electrical routing features 310 may include a plurality of electrical routing features 310 spaced on one, two, three, or four sides of the interposer 130, as illustrated. The electrical routing features 310 may be coupled to one or more electrical lines 312. The electrical lines 312 may include routing for power, control, and/or feedback to the interposer 130 via the frame 300.

FIG. 3B schematically illustrates an embodiment of the bottom side of frame 300 where the frame 300 of FIG. 3A is flipped from top to bottom. The electrical lines 312 of FIG. 3A are removed from FIG. 3B for clarity, but if present would be illustrated on the bottom portion of FIG. 3B. Complementary interlocks 135 are schematically illustrated in FIG. 3B as the intersection between the lighter shaded portion and the darker shaded portion of the bottom of frame 300. In this embodiment, the lighter shaded portion may rest on the interposer 130 and the darker shaded portion may rest on the circuit board 122 of FIG. 2. This configuration may align the frame 300 with the interposer 130 on circuit board 122 and may provide alignment of a BGA of package substrate 121 of FIG. 1 with the pads 202 of the interpose 130 of FIG. 2.

Various components of the frame 300 may be composed of one or more or high temperature plastic or plastic, metal, or ceramic, including composites of the foregoing. By way of example, the frame 300 may be composed of a polyimide polymer or a phenolic plastic.

FIG. 4 schematically illustrates a side view of a package alignment system 400, in accordance with some embodiments. The package alignment system ("alignment system") 400 may include a package alignment frame ("frame") 300 of FIG. 3 coupled to an integrated circuit (IC) assembly 200 of FIG. 2, including a circuit board 122 with an interposer 130. The frame 300 may include body 302 with an opening 304 of FIG. 3A (not shown) to receive a package substrate 121 with die 102 coupled to the package substrate 121, as illustrated in FIG. 1. The frame 300 may include coupling appendages 306 with holes 308 to align with the attachment features 136 of the circuit board 122, as illustrated. The frame 300 may include electrical routing features 310. The electrical routing features 310 may include pogo pins, as illustrated. A plurality of pogo pins may be press fit into frame 300, as illustrated. For illustration purposes, a hole to receive a pogo pin of the electrical routing features 310 is shown without a pogo pin. The pogo pins may contact interconnects 138 of the interposer 130.

A mechanical fastener 402 may couple the frame 300 to the IC assembly 200. The mechanical fastener 402 may include a head 404, a locking portion 406, and a washer 408. The locking portion 406 may pass through the appendages 306 of the frame 300 and through the attachment features 136 of the circuit board 122. The locking portion 406 may receive a locking device to firmly fix the frame 300 to the IC assembly 200. In some embodiments, the mechanical fastener 402 may be a rivet. In some embodiments, the rivet may be plastic and may be removable. In some embodiments, the mechanical device may include a locking feature on locking portion 406. The locking feature may be a cantilever device to couple to the attachment features 136. The mechanical fastener 402 may provide vertical force to compress the pogo pins of the electrical routing features 310 to make contact with the interconnects 138 of the interposer 130. Electrical lines may be coupled to the pogo pins to provide power and communication lines with the interposer 130 via the pogo pins.

A package substrate 121 with die 102 may be placed in the frame 300 and coupled to the interposer 130 via reflow of a BGA on the package substrate 121, as illustrated in FIG. 1. After coupling of the package substrate 121 with die 102 to the interposer 130, the frame 300 may be removed to provide the IC assembly 100 of FIG. 1.

Figure 5A:
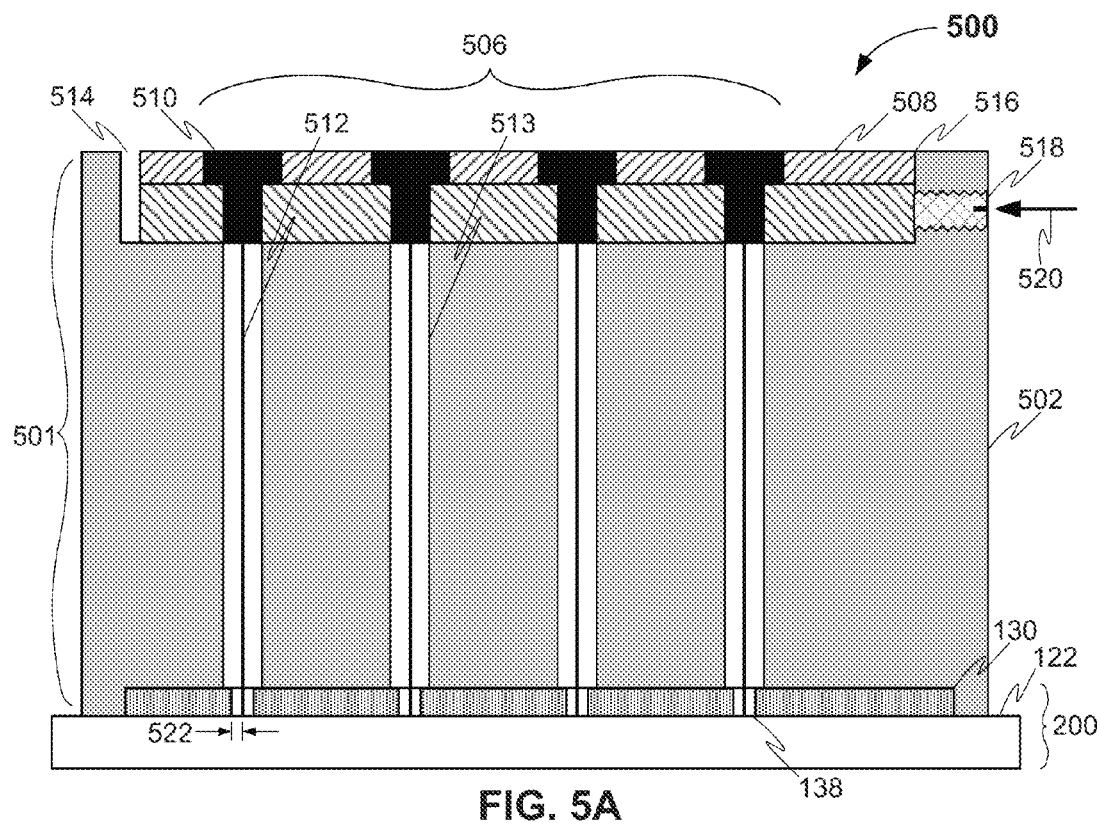
FIG. 5A and FIG. 5B schematically illustrate a side view of a package alignment system, in accordance with some embodiments.
Figure 5B:
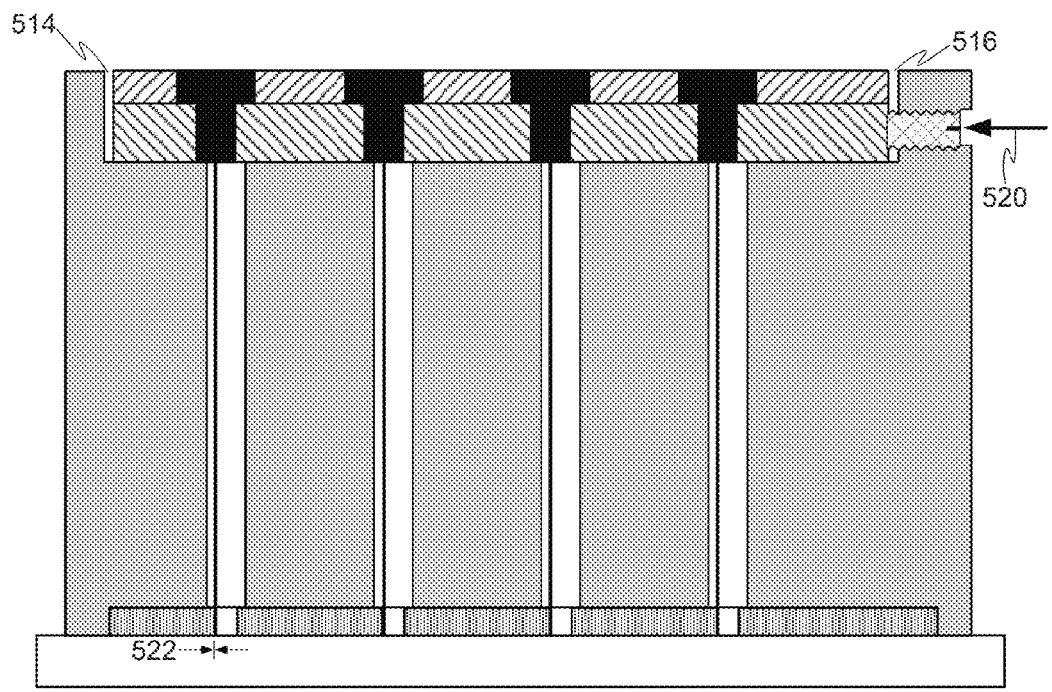

FIG. 5A and FIG. 5B schematically illustrate a side view of a package alignment system 500, in accordance with some embodiments. The package alignment system ("alignment system") 500 may include a package alignment frame ("frame") 501 coupled to an integrated circuit (IC) assembly 200 of FIG. 2, including a circuit board 122 with an interposer 130.

The frame 501 may include body 502 with an opening 304 of FIG. 3A (not shown in FIG. 5) to receive a package substrate 121 with die 102 coupled to the package substrate 121, as illustrated in FIG. 1. An interlock and a lock feature are not shown in FIG. 5 for clarity. However, an interlock may be present on the frame 501 and the interposer 130 and/or circuit board 122 to align the frame 501 over the interposer 130. Additionally, a lock feature may be on frame 501 to lock frame 501 to the interposer 130 and/or the circuit board 122 to couple IC assembly 200 to the interposer 130 via reflow of a BGA on the IC assembly 200 to couple to pads of the interposer 130.

The frame 501 may include electrical routing features 506. The electrical routing features 506 may include a head portion 510 and contact portion 512. The head portion 510 may be coupled to a mount 508 of the frame 501. The contact portion 512 may be inside a hole 513 through the body 502 of frame 501. The contact portion 512 may be inside interconnect 138 of interposer 130. The interconnect 138 may be a slot or hole with a conductive perimeter such as a metal coupled to the slot or hole. The contact portion may not be in contact with the conductive perimeter of the interconnect 138 when the frame 501 is coupled to the IC assembly 200, as illustrated by a distance 522.

The mount 508 may be coupled to the body 502 to allow the mount 508 to move across body 502. The mount 508 may be coupled to a mechanical device 518 to move the mount 508 across body 502. The mechanical device 518 may be a screw, as illustrated. The mechanical device 518 may push the mount 508, as indicated by an arrow 520. Prior to moving the mount 508, the contact portion 512 may be inside the interconnect 138, as described herein. There may be a gap 514 between the mount 508 and the body 502 prior to moving the mount 508 via the mechanical device 518. There may be no gap 516 between the mount 508 and the body 502 at a location near the mechanical device 518, as illustrated.

The mount 508 may be moved using the mechanical device 518 as illustrated in FIG. 5B. The gap 514 may be smaller after the mount 508 is moved by the mechanical device 518. The no gap 516 location may have a gap, as illustrated. The contact portion 512 may be in contact with the conductive perimeter of the interconnect 138 after the mount 508 is moved, as illustrated by distance 522 being zero. A contact between the contact portion 512 and the interconnects 138 may allow power and communications to flow to the interposer through the frame 501 by connecting the electrical routing features 506 to power and communications lines.

A package substrate 121 with die 102 may be placed in the frame 501 and coupled to the interposer 130 via reflow of a BGA on the package substrate 121, as illustrated in FIG. 1. After coupling of the package substrate 121 with die 102 to the interposer 130, the frame 501 may be removed to provide the IC assembly 100 of FIG. 1.

In some embodiments, the interposer 130 may be coupled to a mounting table. The frame 501 may be coupled to the interposer 130. The package substrate 121 may be placed in the frame 501 and coupled to the interposer 130 via reflow of a ball grid array of the package substrate 121.

In some embodiments, the frame 501 may be a first frame of a two frame system for coupling a package substrate 121 to the interposer 130. A second package alignment frame (second alignment frame) may be used to mount the interposer 130 to the circuit board 122 after the package substrate 121 is coupled to the interposer 130 on the mounting table. The second frame may have an open space to receive the frame 501, and the second frame may have coupling appendages 306 with holes 308 or an equivalent type of mechanical fastening device or system as illustrated in FIGS. 3-4. The frame 501 may be configured to slide inside a second frame within reasonable engineering tolerances. The second frame may be configured to allow the mount 508 to be moved via the mechanical device 518.

Various components of the package alignment system 500 may be composed of one or more or high temperature plastic or plastic, metal, or ceramic, including composites of the foregoing. By way of example, the frame 501 may be composed of a polyimide polymer or a phenolic plastic.

Figure 6A:
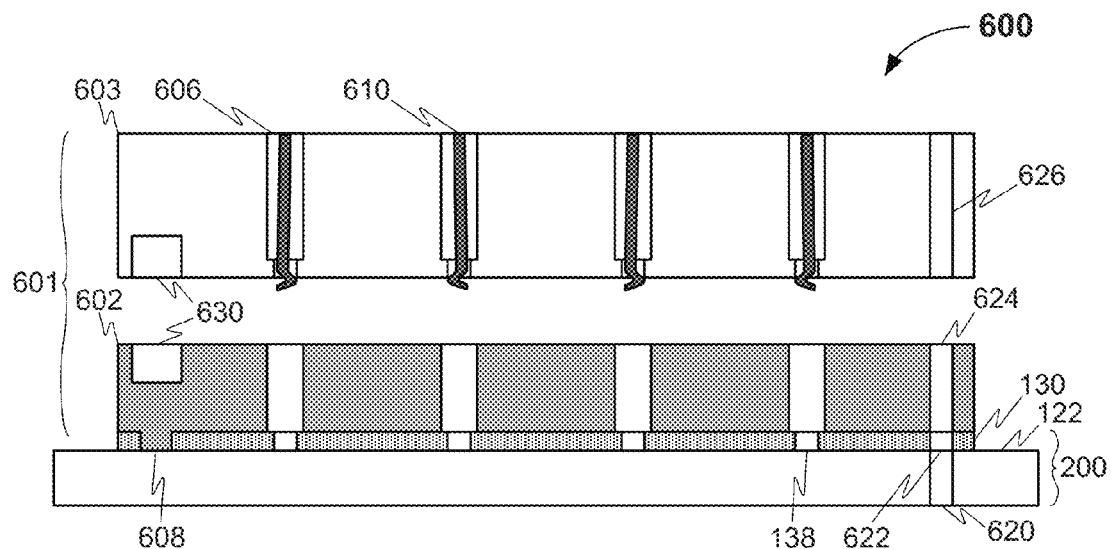
FIGS. 6A, 6B, and 6C schematically illustrate a side view of a package alignment system, in accordance with some embodiments.
Figure 6B:
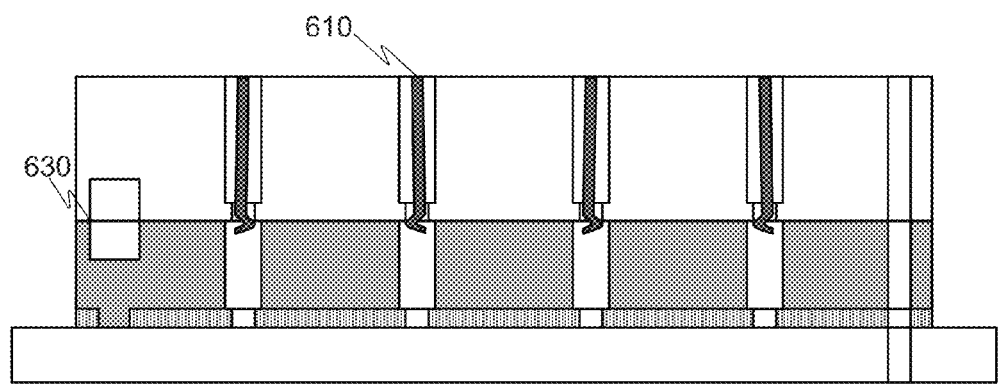
Figure 6C:
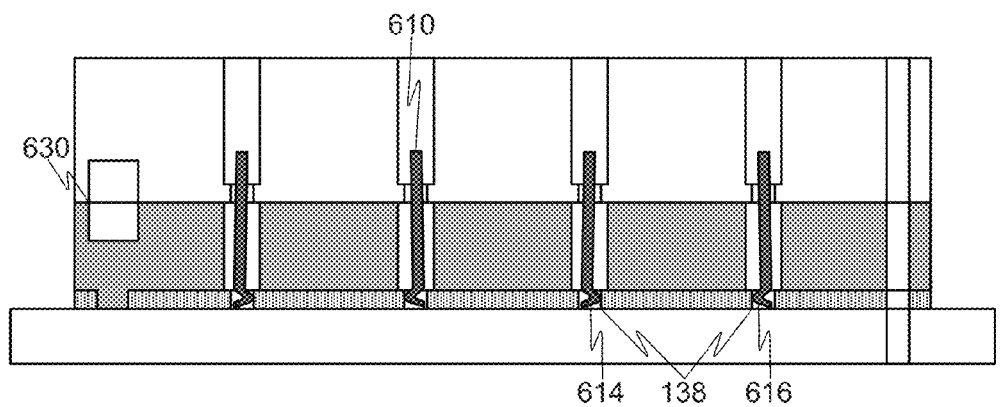

FIGS. 6A, 6B, and 6C schematically illustrate a side view of a package alignment system 600, in accordance with some embodiments. The package alignment system ("alignment system") 600 may include a package alignment frame ("frame") 601 coupled to an integrated circuit (IC) assembly 200 of FIG. 2, including a circuit board 122 with an interposer 130. The frame 601 may include a lower body 602 and an upper body 603, both with an opening 304 of FIG. 3A (not shown in FIGS. 6A-6C) to receive a package substrate 121 with die 102 coupled to the package substrate 121, as illustrated in FIG. 1.

The frame 601 may have the lower body 602 coupled to the IC assembly 200, as illustrated. The lower body 602 may include interlock 608 to align the lower body 602 to the IC assembly 200. The interlock 608 may be a protrusion to fit into a slot of the interposer 130, as illustrated. The upper body 603 of frame 601 may be coupled to the lower body 602 after the lower body 602 is coupled to the IC assembly 200.

The frame 601 may include electrical routing features 606, which may extend through the upper body 603 and the lower body 602. The electrical routing features 606 may include cantilever contacts 610. The cantilever contacts 610 may be biased up inside the upper body 603 via a spring mechanism 630, to prevent damage to the cantilever contacts 610 during coupling of the upper body 603 to the lower body 602. The spring mechanism 630 may be incorporated into the electrical routing features 606.

After the upper body 603 is coupled to the lower body 602, the cantilever contacts 610 may be engaged in interconnects 138 of the interposer 130, as illustrated. The interconnects 138 may be slots or holes with conductive material inside the slots or holes to couple electrically with the cantilever contacts 610. The cantilever contacts 610 may be paired in opposite directions 614, 616 to provide neutral lateral force when cantilever contacts 610 are engaged in interconnects 138. A contact between the cantilever contacts 610 and the interconnects 138 may allow power and communications to flow to the interposer 130 through the frame

601 by connecting the electrical routing features 606 to power and communications lines.

In some embodiments, the package alignment system 600 may include a lock feature 620, 622, 624, 626, which may include a mechanical fastener coupling the IC assembly 200 to the lower body 602 and the upper body 603 of frame 601. The mechanical fastener may be a screw.

After the frame 601 is coupled to the IC assembly 200, the package substrate 121 with die 102 may be placed in the frame 601 and coupled to the interposer 130 via reflow of a BGA on the package substrate 121, as illustrated in FIG. 1. After coupling of the package substrate 121 with die 102 to the interposer 130, the frame 601 may be removed to provide the IC assembly 100 of FIG. 1.

In some embodiments, the interposer 130 may be coupled to a mounting table. The frame 601 may be coupled to the interposer 130. The package substrate 121 may be placed in the frame 601 and coupled to the interposer 130 via reflow of a ball grid array of the package substrate 121 as described herein.

In some embodiments, the frame 601 may be a first frame of a two frame system for coupling a package substrate 121 to the interposer 130. A second package alignment frame (second alignment frame) may be used to mount the interposer 130 to the circuit board 122 after the package substrate 121 is coupled to the interposer 130 on the mounting table. The second frame may have an open space to receive the frame 601, and the second frame may have coupling appendages 306 with holes 308 or an equivalent type of mechanical fastening device or system as illustrated in FIGS. 3-4. The frame 601 may be configured to slide inside a second frame within reasonable engineering tolerances.

Various components of the package alignment system 600 may be composed of one or more or high temperature plastic or plastic, metal, or ceramic, including composites of the foregoing. By way of example, the frame 601 may be composed of a polyimide polymer or a phenolic plastic.

Figure 7:
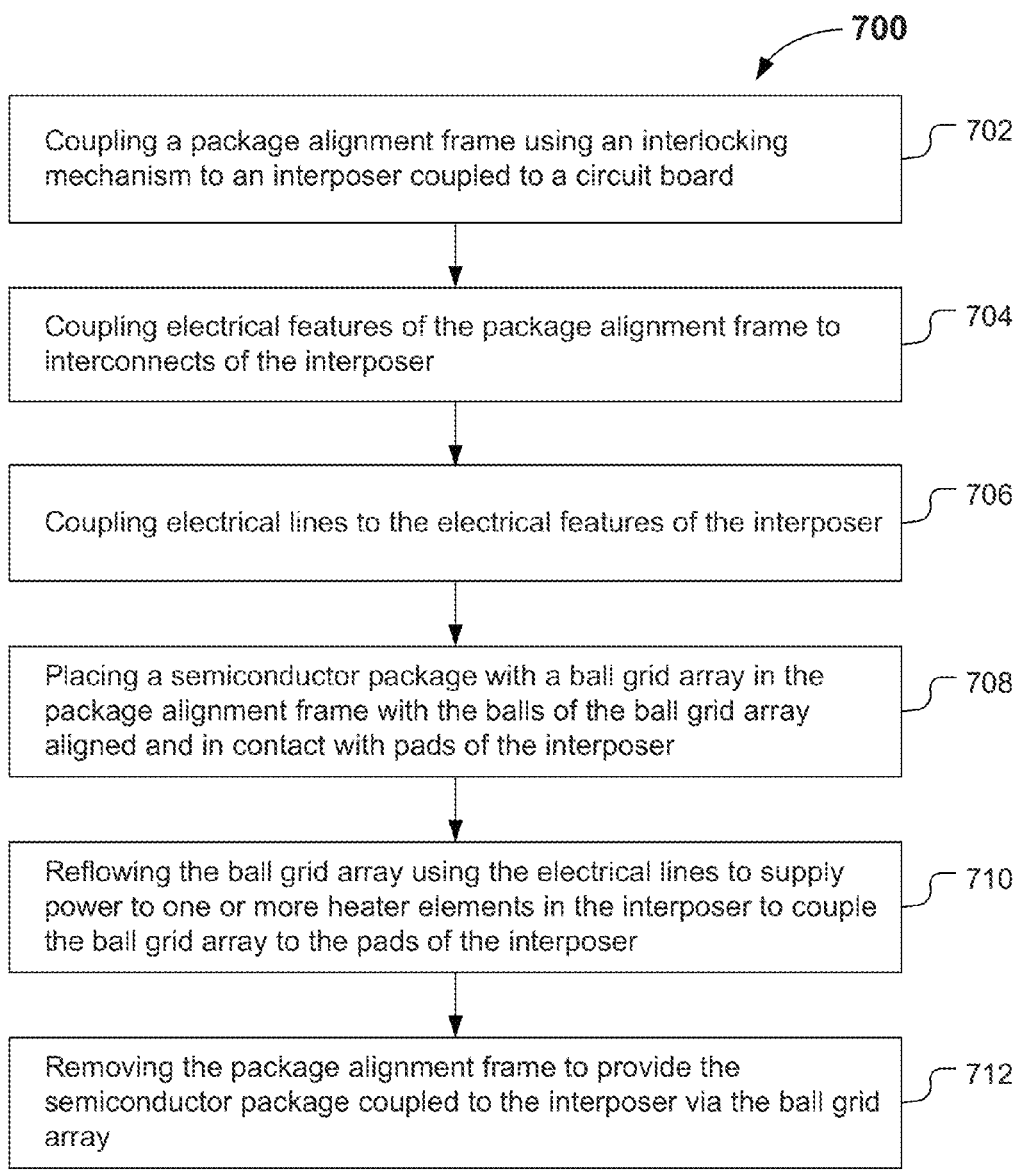
FIG. 7 schematically illustrates a process to couple a semiconductor package to an interposer using a local reflow process, in accordance with some embodiments.

FIG. 7 schematically illustrates a process 700 to couple a semiconductor package to an interposer using a local reflow process, in accordance with some embodiments.

At 702 of the process 700, a package alignment frame may be coupled, using an interlocking mechanism, to an interposer that may be coupled to a circuit board. The package alignment frame may be as illustrated in FIGS. 3-6 and described previously. The interposer coupled to the circuit board may be as illustrated in FIGS. 1-2 and as described previously. The interlocking mechanism may be as illustrated in FIGS. 1-6 and as described previously. In some embodiments, the coupling of the package alignment frame to the interposer further may comprise locking the package alignment frame to the circuit board via mechanical fastener coupling appendages of the package alignment frame to attachment features of the circuit board, as illustrated in FIG. 4 and/or as described herein. In some embodiments, coupling the package alignment frame using an interlocking mechanism to an interposer coupled to a circuit board may comprise coupling a lower frame of the package alignment frame using an interlocking mechanism to an interposer coupled to a circuit board; and coupling an upper frame of the package alignment frame to the lower frame. In some embodiments, coupling of the electrical features of the package alignment frame to interconnects of the interposer may comprise moving cantilever contacts from the upper frame through the lower frame to contact ends of the cantilever contacts with the interconnects of the interposer.

At 704 of the process 700, electrical features of the package alignment frame may be coupled to interconnects of the interposer. The electrical features may be as illustrated in FIGS. 3-6 and/or as described herein. The interconnects of the interposer may be as previously illustrated in FIGS. 1-6 and/or as described herein. Coupling electrical features of the package alignment frame with interconnects of the interposer may comprise sliding a mount movably coupled to a top of the package alignment frame and coupled to the electrical features to contact a contact portion of the electrical features with the interconnects of the interposer, as illustrated in FIG. 5 and/or as described herein.

At 706 of the process 700, electrical lines may be coupled to the electrical features of the interposer. The electrical lines may be as illustrated in FIGS. 1 and 3 and may be as described herein.

At 708 of the process 700, a semiconductor package with a ball grid array may be placed in the package alignment frame with the balls of the ball grid array aligned and in contact with pads of the interposer. The semiconductor package may be as illustrated in FIG. 1 and/or as described herein. For example, the semiconductor package may be package substrate 121 with die 102 coupled to the package substrate 121. The pads of the interposer may be as illustrated in FIG. 2 and/or as described herein.

At 710 of the process 700, the ball grid array may be reflowed using the electrical lines to supply power to one or more heater elements in the interposer to couple the ball grid array to the pads of the interposer. The electrical lines may be as illustrated in FIGS. 1 and 3 and/or as described herein. The heater elements of the interposer may be as illustrated in FIG. 2 and/or as described herein. During reflow, the package alignment frame may provide structural support to the interposer and/or the circuit board to counteract force associated with thermal expansion from the heat of reflow.

At 712 of the process 700, the package alignment frame may be removed to provide the semiconductor package coupled to the interposer via the ball grid array. The semiconductor package coupled to the interposer may be the IC assembly of FIG. 1.

FIGS. 8A-8D schematically illustrates a second alignment frame 800, in accordance with some embodiments. FIG. 8A schematically illustrates a top view of the second alignment frame 800, in accordance with some embodiments. FIG. 8B schematically illustrates a bottom view of the second alignment frame 800, in accordance with some embodiments. FIG. 8C schematically illustrates a side view of the second alignment frame 800 and a first alignment frame, in accordance with some embodiments. FIG. 8D schematically illustrates a side view of the second alignment frame 800 and a first alignment frame slide into the second alignment frame, in accordance with some embodiments. For clarity, the various components of FIGS. 8A-8D are not shaded or filled, except for first alignment frame 850.

The second alignment frame 800 may include a body 802, open space 804, appendages 806, and holes 808 or equivalent fastening system. The second alignment frame 800 may have complementary interlocks 835 to couple to interlocks of an interposer and/or a circuit board. The open space 804 may have surfaces 840.

Various components of the frame 800 may be composed of one or more or high temperature plastic or plastic, metal, or ceramic, including composites of the foregoing. By way of example, the body 802 may be composed of a polyimide polymer or a phenolic plastic.

The open space 804 may be to receive a first alignment frame 850. The first alignment frame 850 may be or include features of the alignment frames as illustrated and/or described in FIGS. 3-6. The appendages 306 illustrated in FIGS. 3A-3B may be absent to allow the first frame 850 to slide into the open space 804 of the second frame 800, as illustrated in FIGS. 8C and 8D. The arrow 852 indicates the first alignment frame 850 being slide into the second alignment frame 800. The first alignment frame 850 may fit snuggly to the surfaces 840, within reasonable engineering tolerances.

The first alignment frame 850 may be to couple a package substrate 121 to an interposer 130. The first alignment frame 850 may be to align a ball grid array 112 of the package substrate 121 to pads 202 of the interposer 130. The interposer 130 may have heating elements 208 to reflow the ball grid array 112. The ball grid array 112 may be reflowed in a reflow oven.

The first alignment frame 850 with the interposer 130 and the package substrate 121 may be slid into the second alignment frame 800, after the second alignment frame 800 is coupled to a circuit board 122. The appendages 808 and the holes 806 may be used to couple the second alignment frame 800 to the circuit board 122. The second alignment frame 800 may be to align a second ball grid array 180 on an opposite side of the interposer 130 with pads 170 of the circuit board 122. The heating elements 208 of the interposer 130 may be used to reflow the second ball grid array 180 to couple the interposer 130 to the circuit board 122. Alternatively, second ball grid array 180 may be reflowed in a reflow oven.

Figure 9:
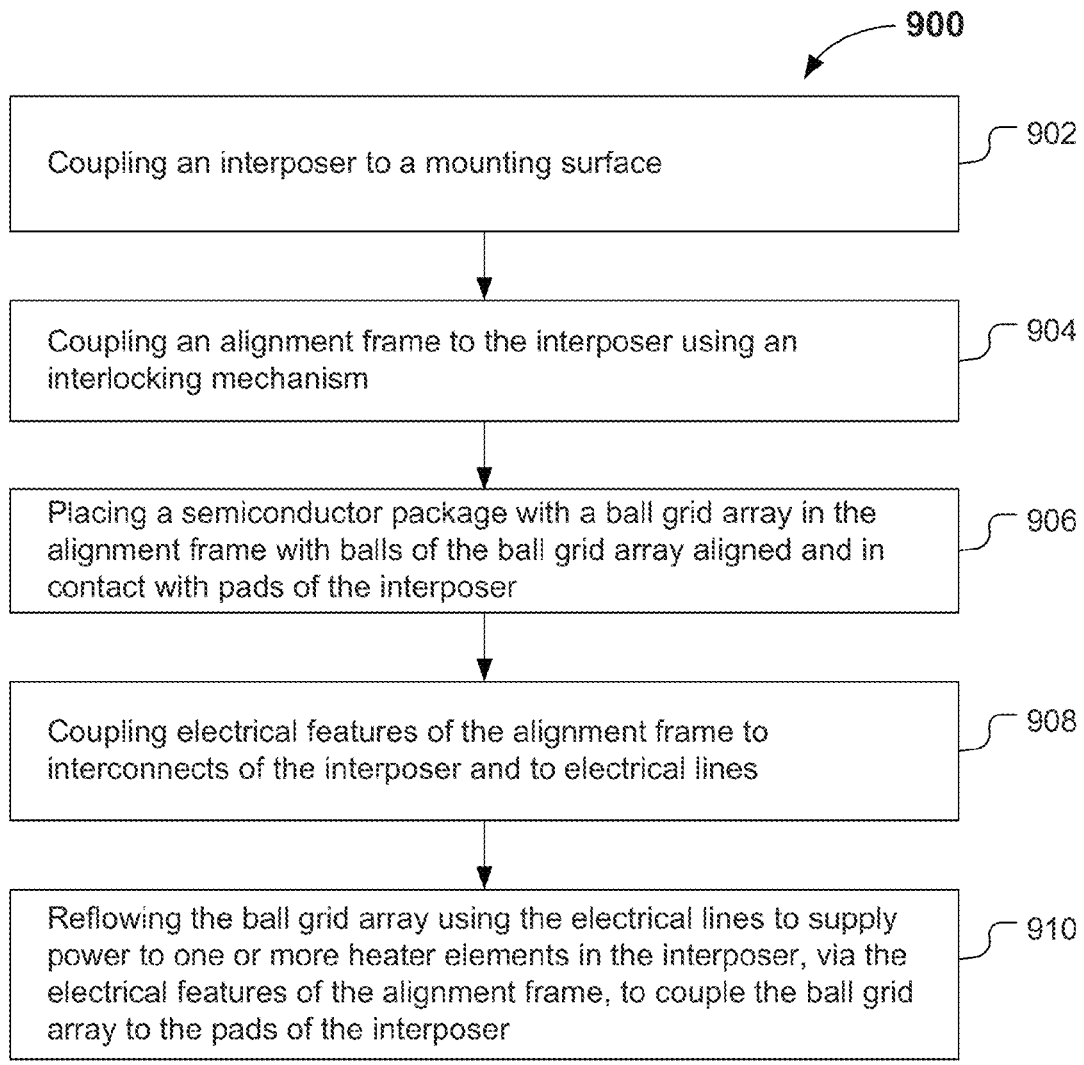
FIG. 9 schematically illustrates a process for coupling a semiconductor package, in accordance with some embodiments.

FIG. 9 schematically illustrates a process 900 for coupling a semiconductor package, in accordance with some embodiments.

At 902 of the process 900, an interposer may be coupled to a mounting surface. The mounting surface may be a table for performing semiconductor fabrication and may include stand offs on a surface of the table. The interposer may be coupled to the stand offs. The interposer may be any one of the various embodiments of an interposer described herein.

At 904 of the process 900, an alignment frame may be coupled to the interposer using an interlocking mechanism. The alignment frame may be any one of the alignment frames shown and/or described herein and equivalents thereof. The interlocking mechanism may be any one or more of the interlocking mechanisms shown and/or described herein and equivalents thereof.

At 906 of the process 900, a semiconductor package with a ball grid array may be placed in the alignment frame with balls of the ball grid array aligned and in contact with pads of the interposer. The semiconductor package may be any one of the semiconductor packages shown and/or described herein and equivalents thereof. The ball grid array may be a ball grid array as shown and/or described herein and equivalents thereof, including those known or readily designed by a person having ordinary skill in the art. The balls of the ball grid array may be coupled to pads on the semiconductor package. The pads of the interposer may be on a first surface of the interposer, the first surface being opposite to a surface facing the mounting surface.

At 908 of the process 900, electrical features of the alignment frame may be coupled to interconnects of the interposer and to electrical lines. The electrical features of the alignment frame may be any one of the electrical features shown and/or described herein and equivalents thereof. The interconnects of the interposer may be any one of the interconnects shown and/or described herein and equivalents thereof. The electrical lines may be any one of the electrical lines shown and/or described herein and equivalents thereof and may be selected to have electrical couplings compatible with the electrical features of the alignment frame.

At 910 of the process 900, the ball grid array may be reflowed using the electrical lines to supply power to one or more heater elements in the interposer, via the electrical features of the alignment frame, to couple the ball grid array to the pads of the interposer. The one or more heater elements may be as shown and/or described herein and equivalents thereof. The power supplied to the heater elements may be sufficient to raise the temperature of the ball grid array to at least a liquidus temperature of the solder of the ball grid array to form a bond between the ball grid array and the pads of the interposer. After reflow, the ball grid array may couple the interposer to the semiconductor package via pads on the interposer and the semiconductor package.

In some embodiments, the process 900 of FIG. 9 further may comprise removing the interposer from the mounting surface, wherein the interposer has the semiconductor package coupled to the interposer via the ball grid array.

In some embodiments, the process 900 of FIG. 9 further may have the coupling of the electrical features of the alignment frame with the interconnects of the interposer comprise sliding a mount movably coupled to a top of the alignment frame and coupled to the electrical features to contact a contact portion of the electrical features with the interconnects of the interposer.

In some embodiments, the process 900 of FIG. 9 further may have the coupling of the alignment frame using the interlocking mechanism to the interposer comprise coupling a lower frame of the alignment frame using the interlocking mechanism to the interposer and coupling an upper frame of the alignment frame to the lower frame, and wherein the coupling the electrical features of the alignment frame to the interconnects of the interposer may comprise moving cantilever contacts from the upper frame through the lower frame to contact ends of the cantilever contacts with the interconnects of the interposer.

In some embodiments, the process 900 of FIG. 9 further may comprise coupling the alignment frame to a circuit board using a second interlocking mechanism, the alignment frame including the interposer coupled with the semiconductor package, wherein the interposer includes a second ball grid array aligned and in contact with pads of the circuit board, wherein the second ball grid array is on a surface opposite the pads of the interposer; and reflowing the second ball grid array to couple the second ball grid array to the pads of the circuit board.

In some embodiments, the process 900 of FIG. 9 further may have the coupling of the alignment frame to the circuit board comprise locking the alignment frame to the circuit board via a mechanical fastener coupling appendages of the alignment frame to attachment features of the circuit board.

In some embodiments, the process 900 of FIG. 9 further may have the reflowing of the second ball grid array to couple the second ball grid array to the pads of the circuit board comprise coupling the electrical features of the alignment frame to the interconnects of the interposer and to the electrical lines; and reflowing the second ball grid array using the electrical lines to supply power to the one or more heater elements in the interposer, via the electrical features of the alignment frame, to couple the second ball grid array to the pads of the circuit board.

In some embodiments, the process 900 of FIG. 9 further may have the reflowing of the second ball grid array to couple the second ball grid array to the pads of the circuit board comprise using a reflow oven to reflow the second ball grid array.

In some embodiments, the process 900 of FIG. 9 further may have the alignment frame as a first alignment frame and the process further may comprise coupling a second alignment frame to a circuit board using a second interlocking mechanism; coupling the first alignment frame to the second alignment frame using a third interlocking mechanism, the first alignment frame including the interposer coupled with the semiconductor package, wherein the interposer includes a second ball grid array aligned and in contact with pads of the circuit board, wherein the second ball grid array is on a surface opposite the pads of the interposer; and reflowing the second ball grid array to couple the second ball grid array to the pads of the circuit board.

In some embodiments, the process 900 of FIG. 9 further may have the coupling of the second alignment frame to the circuit board further comprise locking the second alignment frame to the circuit board via a mechanical fastener coupling appendages of the second alignment frame to attachment features of the circuit board.

In some embodiments, the process 900 of FIG. 9 further may have the reflowing of the second ball grid array to couple the second ball grid array to the pads of the circuit board comprise coupling the electrical features of the alignment frame to the interconnects of the interposer and to the electrical lines; and reflowing the second ball grid array using the electrical lines to supply power to the one or more heater elements in the interposer, via the electrical features of the first alignment frame, to couple the second ball grid array to the pads of the circuit board.

In some embodiments, the process 900 of FIG. 9 further may have the reflowing of the second ball grid array to couple the second ball grid array to the pads of the circuit board comprise using a reflow oven to reflow the second ball grid array.

Figure 10:
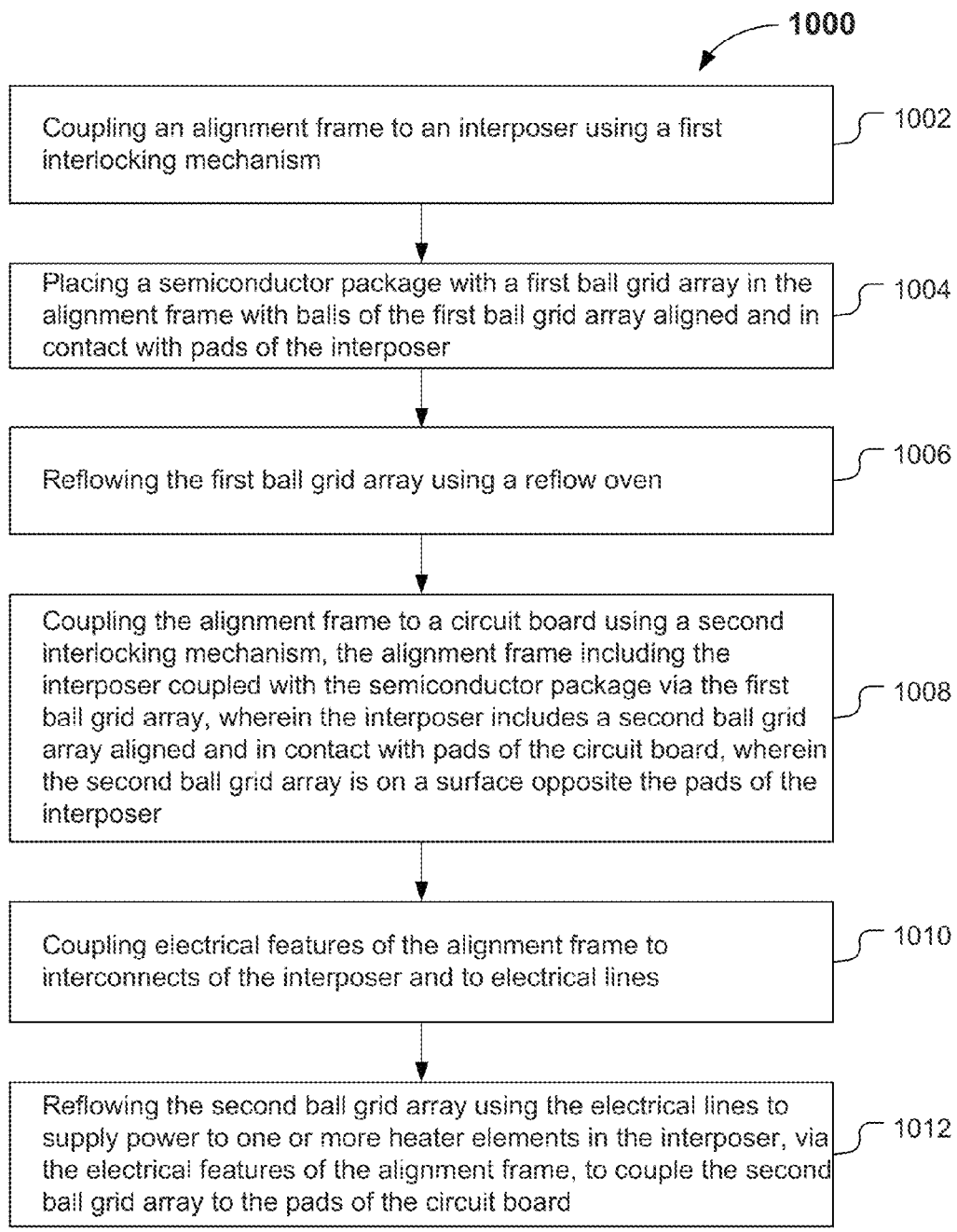
FIG. 10 illustrates a process for coupling a semiconductor package, in accordance with some embodiments.

FIG. 10 illustrates a process 1000 for coupling a semiconductor package, in accordance with some embodiments.

At 1002 of the process 1000, an alignment frame may be coupled to an interposer using a first interlocking mechanism. The alignment frame may be any one of the alignment frames shown and/or described herein and equivalents thereof. The interlocking mechanism may be any one or more of the interlocking mechanisms shown and/or described herein and equivalents thereof.

At 1004 of the process 1000, placing a semiconductor package with a first ball grid array in the alignment frame with balls of the first ball grid array aligned and in contact with pads of the interposer. The semiconductor package may be any one of the semiconductor packages shown and/or described herein and equivalents thereof. The first ball grid array may be a ball grid array as shown and/or described herein and equivalents thereof, including those known or readily designed by a person having ordinary skill in the art. The balls of the first ball grid array may be coupled to pads on the semiconductor package. The pads of the interposer may be on a first surface of the interposer, the first surface being opposite to a surface of the interposer facing a mounting surface.

At 1006 of the process 1000, reflowing the first ball grid array using a reflow oven. The interposer with the alignment frame and the semiconductor package may be placed in a reflow oven to reflow the first ball grid array. The reflow oven may be at a temperature to bring the solder of the balls of the ball grid array to a liquidus temperature of the solder to couple the interposer to the semiconductor package. The interposer with the alignment frame and the semiconductor package may be removed from the reflow oven after coupling of the interposer to the semiconductor package. The alignment frame may be removed or may remain coupled to the interposer.

At 1008 of the process 1000, the alignment frame may be coupled to a circuit board using a second interlocking mechanism, the alignment frame including the interposer coupled with the semiconductor package via the first ball grid array, wherein the interposer includes a second ball grid array aligned and in contact with pads of the circuit board, wherein the second ball grid array is on a surface opposite the pads of the interposer. In some embodiments, the alignment frame may be coupled to the interposer when the alignment frame is coupled to the circuit board. The circuit board may be as described herein and equivalents thereof. The second interlocking mechanism may be one of the interlocking mechanisms described herein and equivalents thereof. The second ball grid array may be composed of a solder having a higher or a lower liquidus temperature in comparison to the solder of the first ball grid array. The second ball grid array may be on a surface of the interposer opposite the surface to which the semiconductor package is attached to the interposer. The alignment frame may be locked to the circuit board using a locking mechanism as described herein and/or equivalents thereof.

At 1010 of the process 1000, electrical features of the alignment frame may be coupled to interconnects of the interposer and to electrical lines. The electrical features of the alignment frame may be any one of the electrical features shown and/or described herein and equivalents thereof. The interconnects of the interposer may be any one of the interconnects shown and/or described herein and equivalents thereof. The electrical lines may be any one of the electrical lines shown and/or described herein and equivalents thereof and may be selected to have electrical couplings compatible with the electrical features of the alignment frame.

At 1012 of the process 1000, reflowing the second ball grid array using the electrical lines to supply power to one or more heater elements in the interposer, via the electrical features of the alignment frame, to couple the second ball grid array to the pads of the circuit board. The power supplied to the heater elements may be sufficient to raise the temperature of the ball grid array to at least a liquidus temperature of the solder of the second ball grid array to form a bond between the second ball grid array and the pads of the circuit board. After reflow, the second ball grid array may couple the interposer to the circuit board via pads on the circuit board and the interposer.

In some embodiments, the process 1000 of FIG. 9 further may have the coupling of the alignment frame to the circuit board further comprise locking the alignment frame to the circuit board via a mechanical fastener coupling appendages of the alignment frame to attachment features of the circuit board.

In some embodiments, the process 1000 of FIG. 10 further may have the coupling the electrical features of the alignment frame with the interconnects of the interposer comprise sliding a mount movably coupled to a top of the alignment frame and coupled to the electrical features to contact a contact portion of the electrical features with the interconnects of the interposer.

In some embodiments, the process 1000 of FIG. 10 further may have the coupling the alignment frame using the first interlocking mechanism to the interposer comprise coupling a lower frame of the alignment frame using the first interlocking mechanism to the interposer; and coupling an upper frame of the alignment frame to the lower frame, and further may have the coupling electrical features of the alignment frame to the interconnects of the interposer comprise moving cantilever contacts from the upper frame through the lower frame to contact ends of the cantilever contacts with the interconnects of the interposer.

Figure 11:
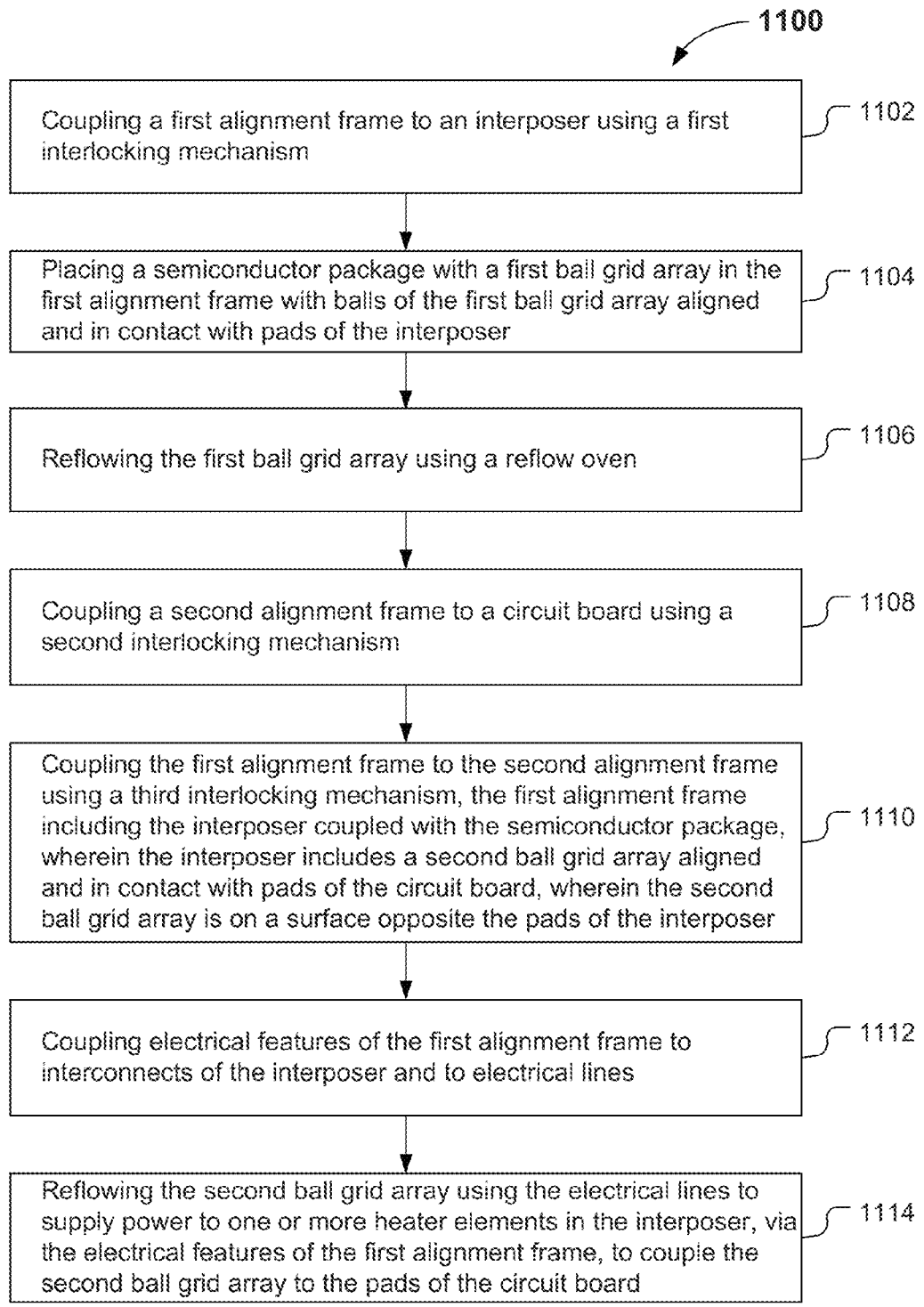
FIG. 11 schematically illustrates a process for coupling a semiconductor package, in accordance with some embodiments.

FIG. 11 schematically illustrates a process 1100 for coupling a semiconductor package, in accordance with some embodiments.

At 1102 of process 1100, a first alignment frame may be coupled to an interposer using a first interlocking mechanism. The first alignment frame may be any one of the alignment frames shown and/or described herein and equivalents thereof. The first interlocking mechanism may be any one or more of the interlocking mechanisms shown and/or described herein and equivalents thereof.

At 1104 of process 1100, a semiconductor package with a first ball grid array may be placed in the first alignment frame with balls of the first ball grid array aligned and in contact with pads of the interposer. The semiconductor package may be any one of the semiconductor packages shown and/or described herein and equivalents thereof. The first ball grid array may be a ball grid array as shown and/or described herein and equivalents thereof, including those known or readily designed by a person having ordinary skill in the art. The balls of the first ball grid array may be coupled to pads on the semiconductor package. The pads of the interposer may be on a first surface of the interposer, the first surface being opposite to a surface of the interposer facing a mounting surface.

At 1106 of process 1100, the first ball grid array may be reflowed using a reflow oven. The reflow oven may be at a temperature to bring the solder of the balls of the first ball grid array to a liquidus temperature of the solder to couple the interposer to the semiconductor package. The interposer with the first alignment frame and the semiconductor package may be removed from the reflow oven after coupling of the interposer to the semiconductor package. The first alignment frame may be removed or may remain coupled to the interposer.

At 1108 of process 1100, a second alignment frame may be coupled to a circuit board using a second interlocking mechanism. The second alignment frame may be a second alignment frame as described herein. The second interlocking mechanism may include one or more of the interlocking mechanisms as described herein. The second alignment frame may include a locking mechanism to lock the second alignment frame to the circuit board via a mechanical fastener coupling appendages of the second alignment frame to attachment features of the circuit board. The circuit board may be as described herein and equivalents thereof.

At 1110 of process 1100, the first alignment frame may be coupled to the second alignment frame using a third interlocking mechanism, the first alignment frame including the interposer coupled with the semiconductor package, wherein the interposer includes a second ball grid array aligned and in contact with pads of the circuit board, wherein the second ball grid array is on a surface opposite the pads of the interposer. The third interlocking mechanism may include one or more of the interlocking mechanisms described herein and equivalents thereof. The third interlocking mechanism may include the first alignment frame slideably fitting within the second alignment frame, with surfaces of the alignment frames in contact with each other within reasonable engineering tolerances. The second ball grid array may be composed of a solder having a higher or a lower liquidus temperature in comparison to the solder of the first ball grid array. The second ball grid array may be on a surface of the interposer opposite the surface to which the semiconductor package is attached to the interposer.

At 1112 of process 1100, electrical features of the first alignment frame may be coupled to interconnects of the interposer and to electrical lines. The electrical features of the first alignment frame may be any one of the electrical features shown and/or described herein and equivalents thereof. The interconnects of the interposer may be any one of the interconnects shown and/or described herein and equivalents thereof. The electrical lines may be any one of the electrical lines shown and/or described herein and equivalents thereof and may be selected to have electrical couplings compatible with the electrical features of the alignment frame.

At 1114 of process 1100, the second ball grid array may be reflowed using the electrical lines to supply power to one or more heater elements in the interposer, via the electrical features of the first alignment frame, to couple the second ball grid array to the pads of the circuit board. The power supplied to the heater elements may be sufficient to raise the temperature of the second ball grid array to at least a liquidus temperature of the solder of the second ball grid array to form a bond between the second ball grid array and the pads of the circuit board. After reflow, the second ball grid array may couple the interposer to the circuit board via pads on the circuit board and the interposer.

In some embodiments, the process 1100 of FIG. 11 further may have the coupling of the electrical features of the first alignment frame with the interconnects of the interposer comprise sliding a mount movably coupled to a top of the first alignment frame and coupled to the electrical features to contact a contact portion of the electrical features with the interconnects of the interposer.

In some embodiments, the process 1100 of FIG. 11 further may have the coupling of the first alignment frame using a first interlocking mechanism to the interposer comprise coupling a lower frame of the first alignment frame using the first interlocking mechanism to the interposer; and coupling an upper frame of the first alignment frame to the lower frame, and further may have the coupling of the electrical features of the first alignment frame to the interconnects of the interposer comprise moving cantilever contacts from the upper frame through the lower frame to contact ends of the cantilever contacts with the interconnects of the interposer.

Figure 12:
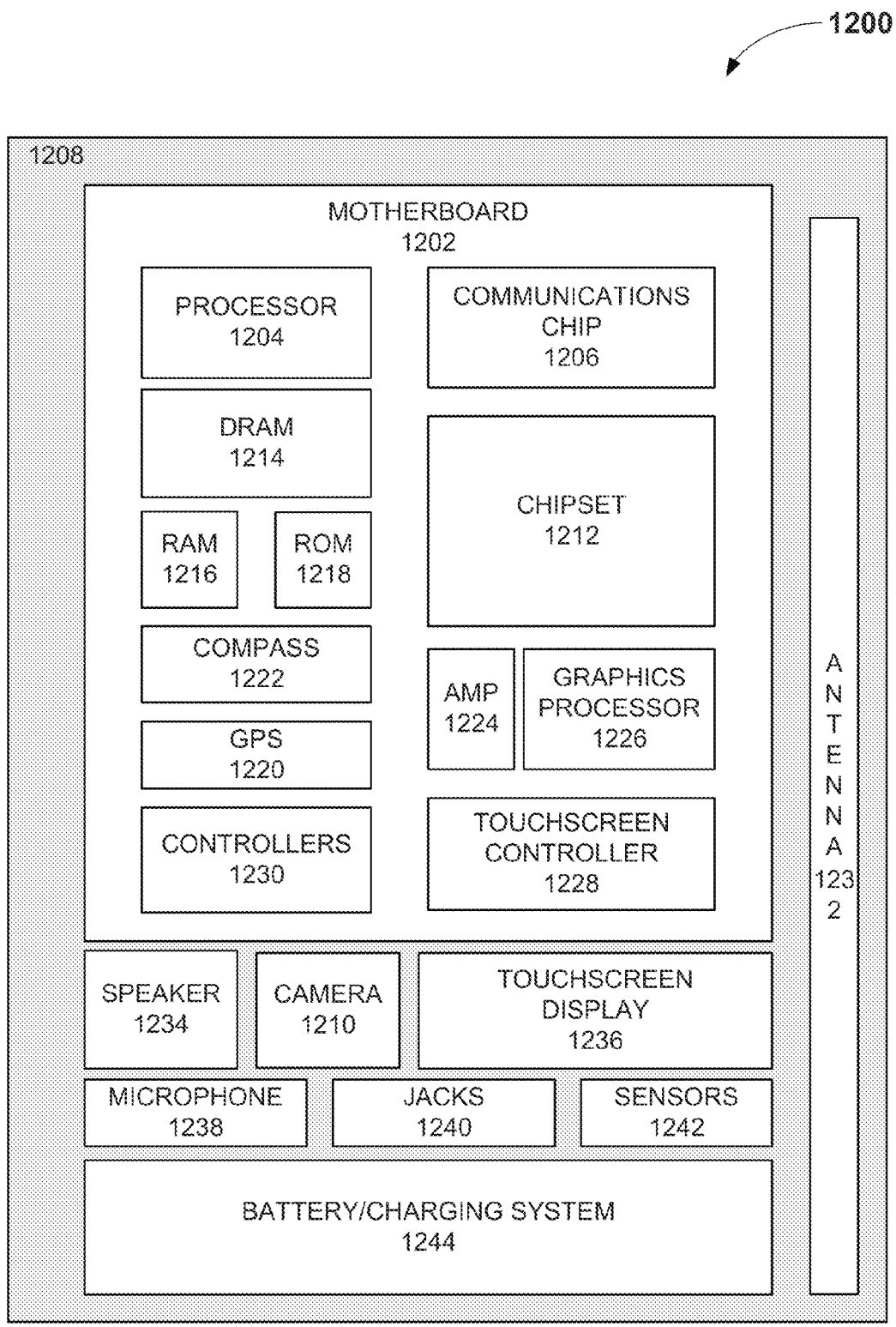
FIG. 12 schematically illustrates a computing device with a semiconductor device coupled to an interposer via local reflow, in accordance with some embodiments.

Embodiments of the present disclosure may be implemented into a system using any suitable hardware and/or software to configure as desired. FIG. 12 illustrates a computing device 1200 with a semiconductor device coupled to an interposer via local reflow, in accordance with some embodiments.

The computing device 1200 may house a board such as motherboard 1202 (e.g., in housing 1208). The motherboard 1202 may include a number of components, including but not limited to a processor 1204 and at least one communication chip 1206. The processor 1204 may be physically and electrically coupled to the motherboard 1202. In some implementations, the at least one communication chip 1206 may also be physically and electrically coupled to the motherboard 1202. In further implementations, the communication chip 1206 may be part of the processor 1204.

Depending on its applications, computing device 1200 may include other components that may or may not be physically and electrically coupled to the motherboard 1202. These other components may include, but are not limited to, volatile memory (e.g., dynamic random access memory (DRAM) 1214), non-volatile memory (e.g., read only memory (ROM) 1218), flash memory, random access memory (RAM) 1216, a graphics processor 1226, a digital signal processor, a crypto processor, a chipset 1212, an antenna 1232, a display, a touchscreen display 1236, a touchscreen controller 1228, a battery 1244, an audio codec, a video codec, a power amplifier 1224, a global positioning system (GPS) device 1220, a compass 1222, microelectromechanical systems (MEMS) sensor 1242, a Geiger counter, an accelerometer, a gyroscope, a speaker 1234, a camera 1210, and a mass storage device (such as hard disk drive), compact disk (CD), digital versatile disk (DVD), controllers 1230, microphone 1238, and/or jacks 1240, and so forth. Not all of these components are illustrated in the figure.

The communication chip 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Institute for Electrical and Electronic Engineers (IEEE) standards including WiGig, Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1206 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1206 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1206 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1206 may operate in accordance with other wireless protocols in other embodiments.

The computing device 1200 may include a plurality of communication chips 1206. For instance, a first communication chip 1206 may be dedicated to shorter range wireless communications such as WiGig, Wi-Fi and Bluetooth and a second communication chip 1206 may be dedicated to longer range wireless communications such as GPS, EDGE, GPRS, CDMA, WiMAX, LTE, EV-DO, and others.

The processor 1204, communication chip 1206, chipset 1212, memory chips 1214, 1216, 1218, and other devices with chips shown in computing device 1200 may contain thin metal films as described herein. The term "processor" may refer to any device or portion of a device that processes electronic data from registers and/or memory to transform that electronic data into other electronic data that may be stored in registers and/or memory.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 1200 may be a mobile computing device in some embodiments. In further implementations, the computing device 1200 may be any other electronic device that processes data.

In various implementations, the computing device 1200 may be a computer system, a server, a rack server, a blade server, and a super computer system, where components commonly used in mobile devices may be absent. In further implementations, the computing device 1200 may be any other electronic device that processes data.

Various components of the computing device 1200 shown as being comprised on the motherboard 1202 are shown as an illustration of the embodiment and are not intended to be limiting.

Figure 13:
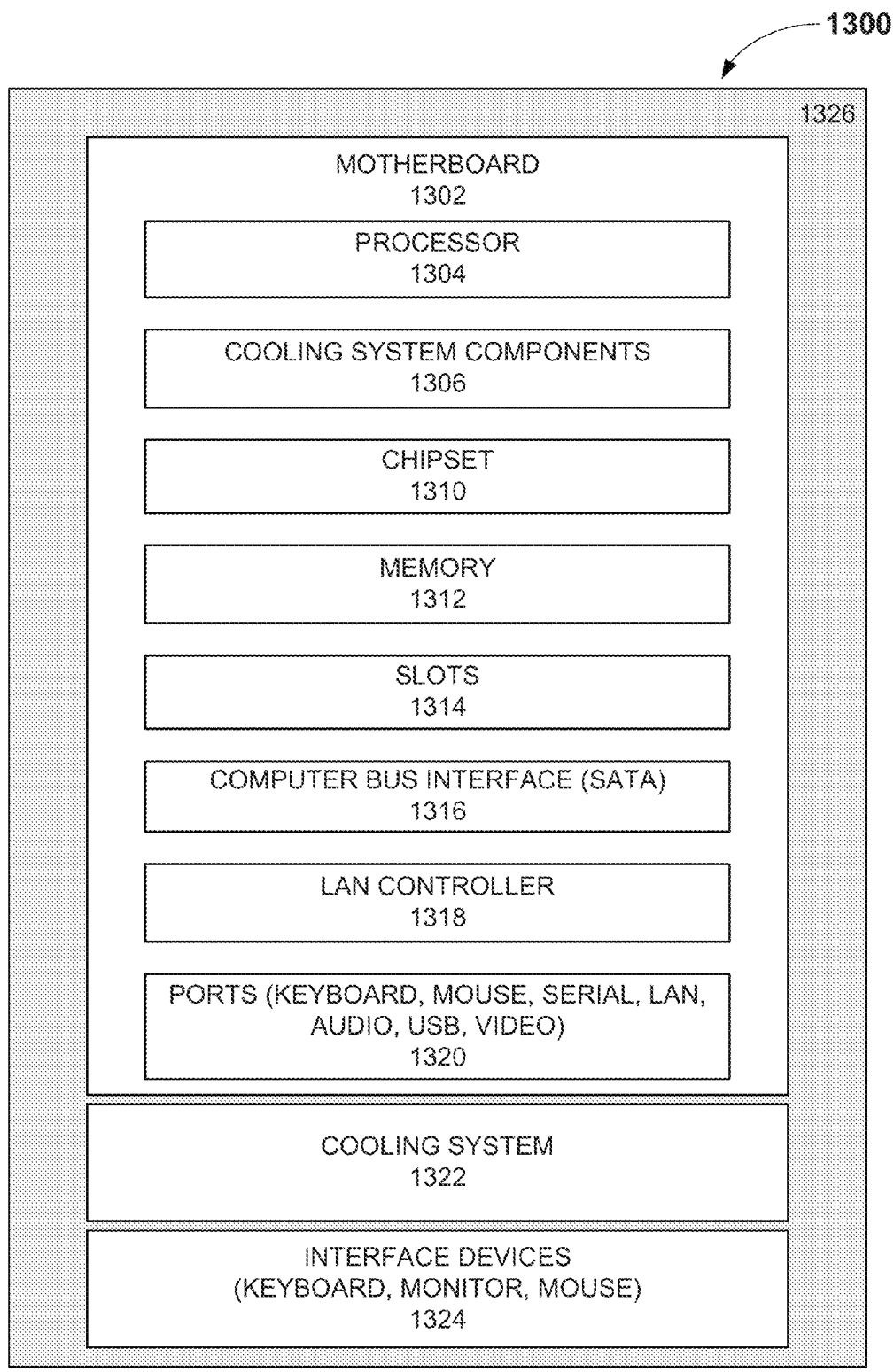
FIG. 13 schematically illustrates a computing device with a semiconductor device coupled to an interposer via local reflow, in accordance with some embodiments.

FIG. 13 schematically illustrates a computing device 1300 with a semiconductor device coupled to an interposer via local reflow as described herein, in accordance with some embodiments.

The computing device 1300 may house a board such as motherboard 1302 (e.g., in housing 1326). The motherboard 1302 may include a number of components, including but not limited to a processor 1304, cooling system components 1306, chipset 1310, memory 1312, slots 1314, computer bus interface 1316, local area network (LAN) controller 1318, cooling system 1322, interface devices 1324, and ports 1320. The chipset 1310 may include a communications chip. The components may be physically and electrically coupled to the motherboard 1302 and may include other components. The term "processor" may refer to any device or portion of a device that processes electronic data from registers and/or memory to transform that electronic data into other electronic data that may be stored in registers and/or memory.

In some embodiments, the cooling system components 1306 may include routing for the cooling fluid and pumping devices for pumping the cooling fluid. In some embodiments, the heat exchangers 1308 may be coupled to various heat generating components of the computing device 1300. The cooling system components 1306 may be coupled to the one or more heat exchangers 1308 to route the cooling fluid through the heat exchangers 1308.

Depending on applications, the computing device 1300 may include other components that may or may not be physically and electrically coupled to the motherboard 1302. These other components may include, but are not limited to, a liquid cooling system, interface devices (keyboard, display, mouse), memory, a graphics processor, a digital signal processor, a crypto processor, a chipset, a touchscreen display, a touchscreen controller, a battery, an audio codec, a video codec, a power amplifier, a speaker, a camera, and a mass storage device (such as hard disk drive, compact disk (CD), digital versatile disk (DVD), and so forth). In various implementations, the computing device 1300 may be a computer system, a server, a rack server, a blade server, and a super computer system. In further implementations, the computing device 1300 may be any other electronic device that processes data.

Various components of the computing device 1300 shown as being comprised on the motherboard 1302 are shown as an illustration of the embodiment and are not intended to be limiting.

EXAMPLES

According to various embodiments, the present disclosure describes semiconductor package alignment frames and systems and processes for local reflow to attach package substrates to circuit boards using the semiconductor package alignment frames.

In Example 1 of a semiconductor package alignment frame for local reflow, the semiconductor package alignment frame may comprise a body that frames a rectangular opening dimensioned to receive a semiconductor package having a ball grid array; an interlock on a bottom of the body to couple with a complementary interlock on at least one of a circuit board or an interposer coupled to the circuit board to provide an interlocking mechanism to center the rectangular opening over the interposer and to align the ball grid array of the package with pads of the interposer; and electrical routing features to couple with a plurality of interconnects of the interposer and electrical lines to provide power to and communications with the interposer via the electrical routing features.

Example 2 may include the subject matter of Example 1 and other examples herein, wherein the electrical routing features traverse through the body from the bottom to a top of the body.

Example 3 may include the subject matter of Example 1 and other examples herein, wherein the interlocking mechanism is to lock the package alignment frame to attach the package to the interposer via local reflow of the ball grid array.

Example 4 may include the subject matter of Example 1 and other examples herein, wherein the semiconductor package alignment frame further may comprise a lock feature to lock the body to at least one of the interposer or the circuit board, wherein the lock feature is lockable when the body is coupled to the interposer via the interlocking mechanism.

Example 5 may include the subject matter of Example 4 and other examples herein, wherein the lock feature may comprise coupling appendages coupled to the body and having a hole traversing through the coupling appendages, wherein the hole of the coupling appendages is to align with attachment features of the circuit board and to receive a mechanical device to lock the body to the circuit board.

Example 6 may include the subject matter of Example 1 and other examples herein, wherein the electrical routing features comprise pogo pins having a fixed end on a top of the body and a spring end at the bottom of the body, wherein the spring end is to electrically couple to the interconnects of the interposer and the fixed end is to electrically couple to the electrical lines.

Example 7 may include the subject matter of Example 1 and other examples herein, wherein the electrical routing features may comprise a head portion coupled to a mount moveably coupled to a top of the body; and a contact portion coupled with the head portion and extending through a hole traversing the body to the bottom of the body, wherein an end of the contact portion extends past the hole of the body at the bottom of the body, wherein the end of the contact portion is to electrically couple with the interconnect of the interposer in response to a movement of the mount across the top of the body.

Example 8 may include the subject matter of Example 1 and other examples herein, wherein the body may comprise a lower body having the interlock on a bottom of the lower body; and an upper body coupleable to the lower body, wherein the electrical routing features traverse through the lower body and the upper body, wherein the electrical routing features comprise cantilever contacts biased up into the upper body, wherein the cantilever contacts are electrically coupleable to the interconnects of the interposer when the interlocking mechanism locks the lower body and the upper body is coupled to the lower body, wherein the cantilever contacts are paired in opposite directions to provide a neutral lateral force in response to a movement of the cantilever contacts through the lower body and into the interconnects of the interposer to provide an electrical contact between the interconnects and the cantilever contacts.

In Example 9 of a semiconductor package alignment system for local reflow, the semiconductor package alignment system may comprise an interposer having a plurality of interconnects, wherein the interposer is coupled to a circuit board, wherein at least one of the circuit board and the interposer include an interlock; and a package alignment frame including a bottom with a complementary interlock coupled to the interlock to provide an interlocking mechanism to lock the package alignment frame, and electrical routing features coupled to the plurality of interconnects of the interposer, and to couple with electrical lines to provide power to and communicate with the interposer, wherein the package alignment frame is aligned over the interposer and includes a rectangular opening dimensioned to receive a package and to align a ball grid array of the package with a plurality of pads of the interposer.

Example 10 may include the subject matter of Example 9 and other examples herein, wherein the electrical routing features traverse through the package alignment frame from the bottom to a top of the package alignment frame.

Example 11 may include the subject matter of Example 9 and other examples herein, wherein the interlocking mechanism is to lock the package alignment frame to attach the package to the interposer via local reflow of the ball grid array.

Example 12 may include the subject matter of Example 9 and other examples herein, wherein the semiconductor package alignment system further may comprise a lock feature; and a mechanical fastener coupling the lock feature to attachment features of at least one of the interposer or the circuit board.

Example 13 may include the subject matter of Example 12 and other examples herein, wherein the lock feature comprises coupling appendages coupled to the package alignment frame and having a hole traversing through the coupling appendages, wherein the attachment features comprise holes traversing through the circuit board, wherein the mechanical fastener comprises a rivet traversing through the hole of the coupling appendages and the holes of the circuit board.

Example 14 may include the subject matter of Example 9 and other examples herein, wherein the electrical routing features comprise pogo pins having a fixed end on a top of the package alignment frame and a spring end at the bottom of the package alignment frame, wherein the spring end is electrically coupled to the interconnects of the interposer and the fixed end is to electrically couple to the electrical lines.

Example 15 may include the subject matter of Example 9 and other examples herein, wherein the electrical routing features further may comprise a head portion coupled with a mount moveably coupled to a top of the package alignment frame; and a contact portion coupled with the head portion and extending through a hole in the package alignment frame to the bottom of the package alignment frame, wherein an end of the contact portion extends inside an interconnect of the plurality of interconnects to couple with the interconnect.

Example 16 may include the subject matter of Example 9 and other examples herein, wherein the package alignment frame further may comprise a lower frame having the complementary interlock on a bottom of the lower frame; and an upper frame coupled to the lower frame, wherein the electrical routing features traverse through the lower frame and the upper frame, wherein the electrical routing features comprise cantilever contacts electrically coupled to the interconnects of the interposer and paired in opposite directions to provide a neutral lateral force.

Example 17 may include the subject matter of Example 9 and other examples herein, wherein the interposer is coupled to the circuit board by a surface mount technology.

Example 18 may include the subject matter of any one of Examples 9-17 and other examples herein, wherein the interposer further may comprise heater elements electrically coupled to the interconnects and to reflow the ball grid array of the semiconductor package to couple the semiconductor package to the pads of the interposer; and electrical circuitry coupled to the interconnects and the heater elements and to send and receive electrical signals via the electrical lines to provide power to the heater elements and to control a temperature of the heater elements.

Example 19 of a process for coupling a semiconductor package to an interposer by local reflow may comprise coupling a package alignment frame to an interposer using an interlocking mechanism, the interposer coupled to a circuit board; coupling electrical features of the package alignment frame to interconnects of the interposer; coupling electrical lines to the electrical features of the interposer; placing a semiconductor package with a ball grid array in the package alignment frame with balls of the ball grid array aligned and in contact with pads of the interposer; reflowing the ball grid array using the electrical lines to supply power to one or more heater elements in the interposer to couple the ball grid array to the pads of the interposer; and removing the package alignment frame to provide the semiconductor package coupled to the interposer via the ball grid array.

Example 20 may include the subject matter of Example 19 and other examples herein, wherein coupling of the package alignment frame to the interposer further may comprise locking the package alignment frame to the circuit board via a mechanical fastener coupling appendages of the package alignment frame to attachment features of the circuit board.

Example 21 may include the subject matter of Example 19 and other examples herein, wherein coupling electrical features of the package alignment frame with interconnects of the interposer may comprise sliding a mount movably coupled to a top of the package alignment frame and coupled to the electrical features to contact a contact portion of the electrical features with the interconnects of the interposer.

Example 22 may include the subject matter of Example 19 and other examples herein, wherein coupling a package alignment frame using an interlocking mechanism to an interposer coupled to a circuit board may comprise coupling a lower frame of the package alignment frame using an interlocking mechanism to an interposer coupled to a circuit board; and coupling an upper frame of the package alignment frame to the lower frame, and wherein coupling electrical features of the package alignment frame to interconnects of the interposer comprises: moving cantilever contacts from the upper frame through the lower frame to contact ends of the cantilever contacts with the interconnects of the interposer.

Example 23 of a computing device may comprise a circuit board with an interposer coupled to the circuit board; and a semiconductor package with a ball grid array coupled to a plurality of pads of the interposer, wherein the interposer includes electrical routing features including interconnects coupled to a surface of the interposer and heater elements to reflow the ball grid array to couple the semiconductor package to the plurality of pads, and includes an interlock to align with and couple to a complementary interlock of a package alignment frame to form an interlocking mechanism with the package alignment frame.

Example 24 may include the subject matter of Example 23 and other examples herein, wherein at least one of the interposer or the circuit board includes a lock feature to couple with coupling appendages of the package alignment frame.

Example 25 may include the subject matter of Example 23 and other examples herein, wherein the interposer is coupled to the circuit board by a surface mount technology.

Example 26 may include the subject matter of Example 23 and other examples herein, wherein the computing device is a wearable device or a mobile computing device, the wearable device or the mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Example 27 may include the subject matter of Example 23 and other examples herein, wherein the computing apparatus is a desktop computer, a server, or a super computer and includes one or more of a display, a processor, a cooling system, a chipset, a memory, a slot, a computer bus interface, a local area network controller, a port, or interface devices coupled with the circuit board.

Example 28 of a process for coupling a semiconductor package may comprise coupling an interposer to a mounting surface; coupling an alignment frame to the interposer using an interlocking mechanism; placing a semiconductor package with a ball grid array in the alignment frame with balls of the ball grid array aligned and in contact with pads of the interposer; coupling electrical features of the alignment frame to interconnects of the interposer and to electrical lines; and reflowing the ball grid array using the electrical lines to supply power to one or more heater elements in the interposer, via the electrical features of the alignment frame, to couple the ball grid array to the pads of the interposer.

Example 29 may include the subject matter of Example 28 and other examples herein, wherein the process further may comprise removing the interposer from the mounting surface, the interposer having the semiconductor package coupled to the interposer via the ball grid array.

Example 30 may include the subject matter of Example 28 and other examples herein, wherein coupling the electrical features of the alignment frame with the interconnects of the interposer may comprise sliding a mount movably coupled to a top of the alignment frame and coupled to the electrical features to contact a contact portion of the electrical features with the interconnects of the interposer.

Example 31 may include the subject matter of Example 28 and other examples herein, wherein coupling the alignment frame using the interlocking mechanism to the interposer comprises coupling a lower frame of the alignment frame using the interlocking mechanism to the interposer and coupling an upper frame of the alignment frame to the lower frame, and wherein coupling the electrical features of the alignment frame to the interconnects of the interposer comprises moving cantilever contacts from the upper frame through the lower frame to contact ends of the cantilever contacts with the interconnects of the interposer.

Example 32 may include the subject matter of Example 28 and other examples herein, wherein the process further may comprise coupling the alignment frame to a circuit board using a second interlocking mechanism, the alignment frame including the interposer coupled with the semiconductor package, wherein the interposer includes a second ball grid array aligned and in contact with pads of the circuit board, wherein the second ball grid array is on a surface opposite the pads of the interposer; and reflowing the second ball grid array to couple the second ball grid array to the pads of the circuit board.

Example 33 may include the subject matter of Example 32 and other examples herein, wherein coupling of the alignment frame to the circuit board further may comprise locking the alignment frame to the circuit board via a mechanical fastener coupling appendages of the alignment frame to attachment features of the circuit board.

Example 34 may include the subject matter of Example 32 and other examples herein, wherein reflowing the second ball grid array to couple the second ball grid array to the pads of the circuit board may comprise coupling the electrical features of the alignment frame to the interconnects of the interposer and to the electrical lines; and reflowing the second ball grid array using the electrical lines to supply power to the one or more heater elements in the interposer, via the electrical features of the alignment frame, to couple the second ball grid array to the pads of the circuit board.

Example 35 may include the subject matter of Example 32 and other examples herein, wherein reflowing the second ball grid array to couple the second ball grid array to the pads of the circuit board may comprise using a reflow oven to reflow the second ball grid array.

Example 36 may include the subject matter of Example 28 and other examples herein, wherein the alignment frame is a first alignment frame and the process further may comprise coupling a second alignment frame to a circuit board using a second interlocking mechanism; coupling the first alignment frame to the second alignment frame using a third interlocking mechanism, the first alignment frame including the interposer coupled with the semiconductor package, wherein the interposer includes a second ball grid array aligned and in contact with pads of the circuit board, wherein the second ball grid array is on a surface opposite the pads of the interposer; and reflowing the second ball grid array to couple the second ball grid array to the pads of the circuit board.

Example 37 may include the subject matter of Example 36 and other examples herein, wherein coupling of the second alignment frame to the circuit board further may comprise locking the second alignment frame to the circuit board via a mechanical fastener coupling appendages of the second alignment frame to attachment features of the circuit board.

Example 38 may include the subject matter of Example 36 and other examples herein, wherein reflowing the second ball grid array to couple the second ball grid array to the pads of the circuit board may comprise coupling the electrical features of the alignment frame to the interconnects of the interposer and to the electrical lines; and reflowing the second ball grid array using the electrical lines to supply power to the one or more heater elements in the interposer, via the electrical features of the first alignment frame, to couple the second ball grid array to the pads of the circuit board.

Example 39 may include the subject matter of Example 36 and other examples herein, wherein reflowing the second ball grid array to couple the second ball grid array to the pads of the circuit board may comprise using a reflow oven to reflow the second ball grid array.

Example 40 of a process for coupling a semiconductor package may comprise coupling an alignment frame to an interposer using a first interlocking mechanism; placing a semiconductor package with a first ball grid array in the alignment frame with balls of the first ball grid array aligned and in contact with pads of the interposer; reflowing the first ball grid array using a reflow oven; coupling the alignment frame to a circuit board using a second interlocking mechanism, the alignment frame including the interposer coupled with the semiconductor package via the first ball grid array, wherein the interposer includes a second ball grid array aligned and in contact with pads of the circuit board, wherein the second ball grid array is on a surface opposite the pads of the interposer; coupling electrical features of the alignment frame to interconnects of the interposer and to electrical lines; and reflowing the second ball grid array using the electrical lines to supply power to one or more heater elements in the interposer, via the electrical features of the alignment frame, to couple the second ball grid array to the pads of the circuit board.

Example 41 may include the subject matter of Example 40 and other examples herein, wherein coupling of the alignment frame to the circuit board further may comprise locking the alignment frame to the circuit board via a mechanical fastener coupling appendages of the alignment frame to attachment features of the circuit board.

Example 42 may include the subject matter of Example 40 and other examples herein, wherein coupling the electrical features of the alignment frame with the interconnects of the interposer may comprise sliding a mount movably coupled to a top of the alignment frame and coupled to the electrical features to contact a contact portion of the electrical features with the interconnects of the interposer.

Example 43 may include the subject matter of Example 40 and other examples herein, wherein coupling the alignment frame using the first interlocking mechanism to the interposer may comprise coupling a lower frame of the alignment frame using the first interlocking mechanism to the interposer; and coupling an upper frame of the alignment frame to the lower frame, and wherein coupling electrical features of the alignment frame to the interconnects of the interposer comprises moving cantilever contacts from the upper frame through the lower frame to contact ends of the cantilever contacts with the interconnects of the interposer.

Example 44 of a process for coupling a semiconductor package may comprise coupling a first alignment frame to an interposer using a first interlocking mechanism; placing a semiconductor package with a first ball grid array in the first alignment frame with balls of the first ball grid array aligned and in contact with pads of the interposer; reflowing the first ball grid array using a reflow oven; coupling a second alignment frame to a circuit board using a second interlocking mechanism; coupling the first alignment frame to the second alignment frame using a third interlocking mechanism, the first alignment frame including the interposer coupled with the semiconductor package, wherein the interposer includes a second ball grid array aligned and in contact with pads of the circuit board, wherein the second ball grid array is on a surface opposite the pads of the interposer; coupling electrical features of the first alignment frame to interconnects of the interposer and to electrical lines; and reflowing the second ball grid array using the electrical lines to supply power to one or more heater elements in the interposer, via the electrical features of the first alignment frame, to couple the second ball grid array to the pads of the circuit board.

Example 45 may include the subject matter of Example 44 and other examples herein, wherein coupling of the second alignment frame to the circuit board further may comprise locking the second alignment frame to the circuit board via a mechanical fastener coupling appendages of the second alignment frame to attachment features of the circuit board.

Example 46 may include the subject matter of Example 44 and other examples herein, wherein coupling the electrical features of the first alignment frame with the interconnects of the interposer may comprise sliding a mount movably coupled to a top of the first alignment frame and coupled to the electrical features to contact a contact portion of the electrical features with the interconnects of the interposer.

Example 47 may include the subject matter of Example 44 and other examples herein, wherein coupling the first alignment frame using a first interlocking mechanism to the interposer may comprise coupling a lower frame of the first alignment frame using the first interlocking mechanism to the interposer; and coupling an upper frame of the first alignment frame to the lower frame, and wherein coupling electrical features of the first alignment frame to the interconnects of the interposer comprises moving cantilever contacts from the upper frame through the lower frame to contact ends of the cantilever contacts with the interconnects of the interposer.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments. The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize. These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor package alignment frame for local reflow, comprising:
    a body comprising four sides that frames a rectangular opening dimensioned to receive a semiconductor package, the body comprising:
        a lower body having an interlock on a bottom of the lower body to couple with a complementary interlock on at least one of a circuit board or an interposer coupled to the circuit board to provide an interlocking mechanism to center the rectangular opening over the interposer and to align a ball grid array of the package with pads of the interposer; and
        an upper body coupleable to the lower body;
    electrical routing features to couple with a plurality of interconnects of the interposer; and
    electrical lines to provide power to and communicate with the interposer via the electrical routing features,
    wherein the electrical routing features traverse through the lower body and the upper body, and comprise cantilever contacts electrically coupleable to the interconnects of the interposer, the cantilever contacts paired in opposite directions to provide a neutral lateral force in response to a movement of the cantilever contacts through the lower body.

2. The semiconductor package alignment frame of claim 1, wherein the interlocking mechanism is to lock the package alignment frame to attach the package to the interposer via local reflow of the ball grid array.

3. The semiconductor package alignment frame of claim 1, further comprising:
    a lock feature to lock the body to at least one of the interposer or the circuit board, wherein the lock feature is lockable when the body is coupled to the interposer via the interlocking mechanism.

4. The semiconductor package alignment frame of claim 3, wherein the lock feature comprises:
    coupling appendages coupled to the body and having a hole traversing through the coupling appendages, wherein the hole of the coupling appendages is to align with attachment features of the circuit board and to receive a mechanical device to lock the body to the circuit board.

5. The semiconductor package alignment frame of claim 1, wherein the electrical routing features comprise pogo pins having a fixed end on a top of the body and a spring end at the bottom of the body, wherein the spring end is to electrically couple to the interconnects of the interposer and the fixed end is to electrically couple to the electrical lines.

6. The semiconductor package alignment frame of claim 1, wherein the electrical routing features comprise:
    a head portion coupled to a mount moveably coupled to a top of the body; and
    a contact portion coupled with the head portion and extending through a hole traversing the body to the bottom of the body, wherein an end of the contact portion extends past the hole of the body at the bottom of the body, wherein the end of the contact portion is to electrically couple with the interconnect of the interposer in response to a movement of the mount across the top of the body.

7. A semiconductor package alignment system for local reflow, comprising:
    an interposer having a plurality of interconnects, wherein the interposer is coupled to a circuit board, and wherein at least one of the circuit board and the interposer include an interlock; and a package alignment frame comprising four sides including:
- a lower frame having a complementary interlock on a bottom of the lower frame, the complementary interlock coupled to the interlock to provide an interlocking mechanism to lock the package alignment frame;
- an upper frame coupled to the lower frame; and
- electrical routing features coupled to the plurality of interconnects of the interposer, and to couple with electrical lines to provide power to and communicate with the interposer, the electrical routing features traversing through the lower frame and the upper frame, wherein the package alignment frame is aligned over the interposer and includes a rectangular opening dimensioned to receive a package, and wherein the electrical routing features comprise cantilever contacts electrically coupled to the interconnects of the interposer and paired in opposite directions to provide a neutral lateral force in response to a movement of the cantilever contacts through the lower frame.

8. The semiconductor package alignment system of claim 7, wherein the interlocking mechanism is to lock the package alignment frame to attach the package to the interposer via local reflow of a ball grid array of the package.

9. The semiconductor package alignment system of claim 7, further comprising:
- a lock feature; and
- a mechanical fastener coupling the lock feature to attachment features of at least one of the interposer or the circuit board.

10. The semiconductor package alignment system of claim 9, wherein the lock feature comprises coupling appendages coupled to the package alignment frame and having a hole traversing through the coupling appendages, wherein the attachment features comprise holes traversing through the circuit board, wherein the mechanical fastener comprises a rivet traversing through the hole of the coupling appendages and the holes of the circuit board.

11. The semiconductor package alignment system of claim 7, wherein the electrical routing features comprise pogo pins having a fixed end on a top of the package alignment frame and a spring end at the bottom of the package alignment frame, wherein the spring end is electrically coupled to the interconnects of the interposer and the fixed end is to electrically couple to the electrical lines.

12. The semiconductor package alignment system of claim 7, wherein the electrical routing features comprise:
- a head portion coupled with a mount moveably coupled to a top of the package alignment frame; and
- a contact portion coupled with the head portion and extending through a hole in the package alignment frame to the bottom of the package alignment frame, wherein an end of the contact portion extends inside an interconnect of the plurality of interconnects to couple with the interconnect.

13. The semiconductor package alignment system of claim 7, wherein the interposer is coupled to the circuit board by a surface mount technology.

14. The semiconductor package alignment system of claim 7, wherein the interposer further comprises:
- heater elements electrically coupled to the interconnects and to reflow a ball grid array of the semiconductor package to couple the semiconductor package to pads of the interposer; and
- electrical circuitry coupled to the interconnects and the heater elements and to send and receive electrical signals via the electrical lines to provide power to the heater elements and to control a temperature of the heater elements.

* * * * *